United States Patent
Jung et al.

(10) Patent No.: US 9,368,223 B2
(45) Date of Patent: Jun. 14, 2016

(54) MEMORY SYSTEM AND READ RECLAIM METHOD THEREOF

(71) Applicant: SAMSUNG ELECTRONICS CO., LTD., Suwon-Si, Gyeonggi-Do (KR)

(72) Inventors: Young Woo Jung, Osan-si (KR); Hwan-Chung Kim, Namwon-si (KR); Kyoungkuy Park, Seoul (KR); Eunju Park, Yongin-si (KR); Bong-Gwan Seol, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/754,884

(22) Filed: Jun. 30, 2015

(65) Prior Publication Data

US 2015/0302928 A1    Oct. 22, 2015

Related U.S. Application Data

(63) Continuation of application No. 14/037,658, filed on Sep. 26, 2013.

(30) Foreign Application Priority Data

Oct. 5, 2012  (KR) .................. 10-2012-0110859

(51) Int. Cl.
| | |
|---|---|
| *G06F 11/07* | (2006.01) |
| *G11C 16/26* | (2006.01) |
| *G06F 12/02* | (2006.01) |
| *G06F 11/10* | (2006.01) |
| *G11C 11/56* | (2006.01) |
| *G11C 16/10* | (2006.01) |
| *G11C 29/52* | (2006.01) |

(52) U.S. Cl.
CPC ............ *G11C 16/26* (2013.01); *G06F 11/1072* (2013.01); *G06F 12/0246* (2013.01); *G06F 12/0253* (2013.01); *G11C 11/5671* (2013.01); *G11C 16/10* (2013.01); *G11C 29/52* (2013.01)

(58) Field of Classification Search
None
See application file for complete search history.

(56) References Cited

U.S. PATENT DOCUMENTS

| | | |
|---|---|---|
| 5,671,388 A | 9/1997 | Hasbun |
| 5,930,167 A | 7/1999 | Lee et al. |

(Continued)

FOREIGN PATENT DOCUMENTS

| | | |
|---|---|---|
| JP | 2001006374 A | 1/2001 |
| JP | 2009064394 A | 3/2009 |

(Continued)

*Primary Examiner* — Henry Tsai
*Assistant Examiner* — John Roche
(74) *Attorney, Agent, or Firm* — Volentine & Whitt, PLLC

(57) ABSTRACT

A memory system includes a nonvolatile memory device including a first memory area formed of memory blocks which store n-bit data per cell and a second memory area formed of memory blocks which store m-bit data per cell, where n and m are different integers, and a memory controller configured to control the nonvolatile memory device. The memory controller is configured to execute a read operation, and to execute a read reclaim operation in which valid data of a target memory block of the second memory area is transferred to one or more memory blocks of the first memory area, the target memory block selected during the read operation. The read reclaim operation is processed as complete when all the valid data of the target memory block is transferred to the one or more memory blocks of the first memory area.

28 Claims, 23 Drawing Sheets

(56) References Cited

U.S. PATENT DOCUMENTS

| | | |
|---|---|---|
| 6,858,906 B2 | 2/2005 | Lee et al. |
| 7,324,375 B2 | 1/2008 | Miwa et al. |
| 7,444,461 B2 | 10/2008 | Traister et al. |
| 7,529,124 B2 | 5/2009 | Cho et al. |
| 7,529,879 B2 | 5/2009 | Kim et al. |
| 7,623,366 B2 | 11/2009 | Park et al. |
| 8,004,895 B2 | 8/2011 | Gonzalez et al. |
| 8,006,166 B2 | 8/2011 | Roohparvar et al. |
| 8,040,744 B2 | 10/2011 | Gorobets et al. |
| 8,423,866 B2 | 4/2013 | Dusija et al. |
| 8,566,671 B1 * | 10/2013 | Ye .................. G06F 11/1048 714/764 |
| 8,589,756 B2 | 11/2013 | Ishikawa et al. |
| 8,762,622 B2 | 6/2014 | Moshayedi et al. |
| 8,886,990 B2 * | 11/2014 | Meir .................. G06F 12/0246 714/6.1 |
| 2003/0002377 A1 | 1/2003 | Sumitani et al. |
| 2004/0169238 A1 | 9/2004 | Lee et al. |
| 2006/0180851 A1 | 8/2006 | Lee et al. |
| 2009/0125671 A1 * | 5/2009 | Flynn .................. G06F 9/52 711/103 |
| 2010/0010040 A1 | 1/2010 | Jones et al. |
| 2010/0062715 A1 | 3/2010 | Kim et al. |
| 2010/0235713 A1 | 9/2010 | Lee et al. |
| 2010/0241796 A1 | 9/2010 | Seol |
| 2010/0309237 A1 | 12/2010 | Roh |
| 2010/0315325 A1 | 12/2010 | Hwang |
| 2010/0318839 A1 | 12/2010 | Avila et al. |
| 2010/0332922 A1 | 12/2010 | Chang et al. |
| 2011/0047422 A1 * | 2/2011 | Aritome ............. G06F 11/1068 714/718 |
| 2012/0030542 A1 | 2/2012 | Borchers et al. |
| 2012/0084490 A1 * | 4/2012 | Choi .................. G11C 16/02 711/103 |
| 2013/0148435 A1 * | 6/2013 | Matsunaga ........ G11C 16/3404 365/185.23 |

FOREIGN PATENT DOCUMENTS

| | | |
|---|---|---|
| KR | 10-0568115 B1 | 3/2006 |
| KR | 10-0673020 B1 | 1/2007 |
| KR | 10-2010-0102925 A | 9/2010 |

* cited by examiner

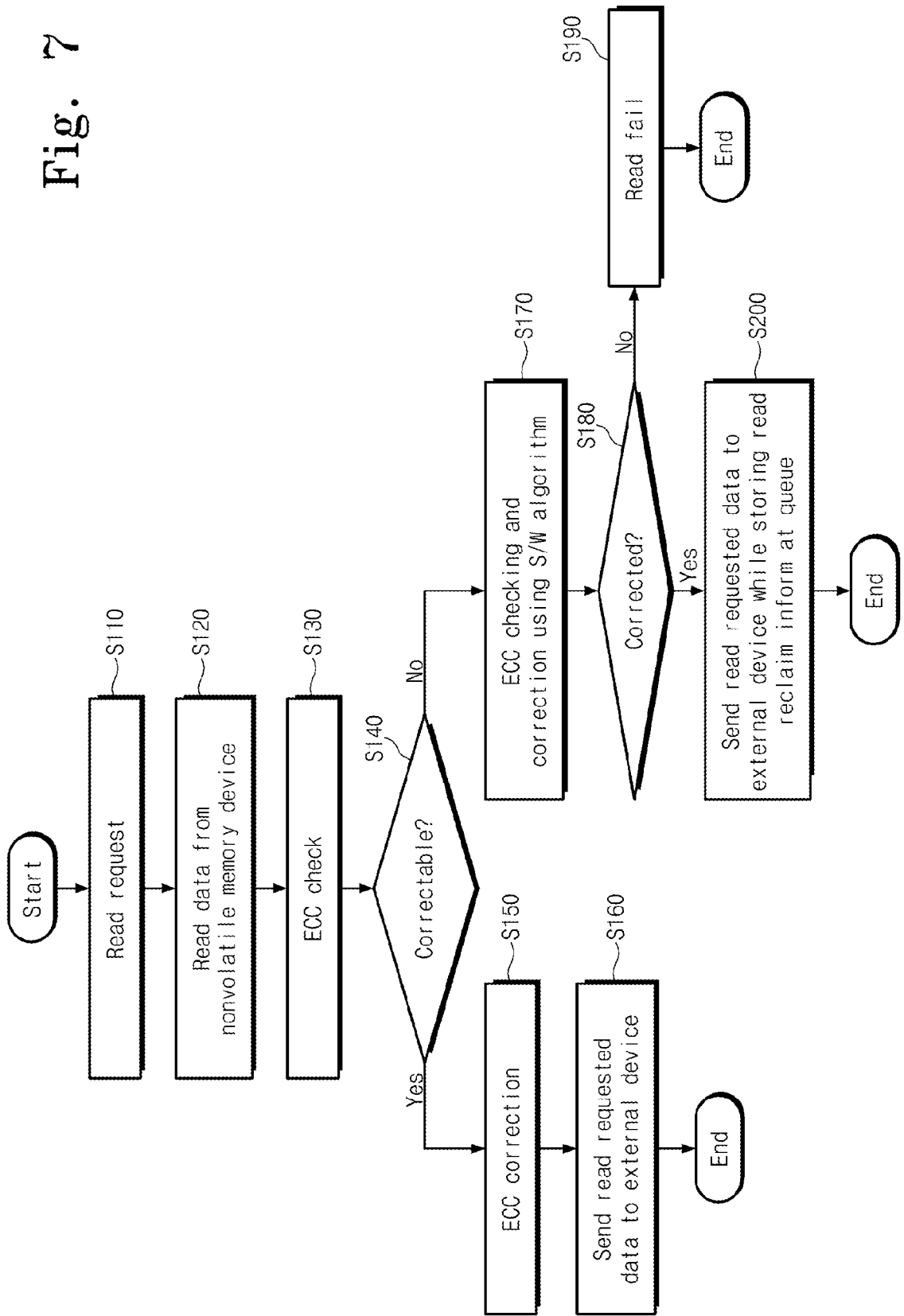

MEMORY SYSTEM AND READ RECLAIM METHOD THEREOF

CROSS-REFERENCE TO RELATED APPLICATIONS

This is a Continuation of U.S. application Ser. No. 14/037,658, filed Sep. 26, 2013, in which a claim for priority under 35 U.S.C. §119 is made to Korean Patent Application No. 10-2012-0110859 filed Oct. 5, 2012, in the Korean Intellectual Property Office, the entire contents of which are hereby incorporated by reference.

BACKGROUND

The inventive concepts described herein relate to semiconductor memory devices, and more particularly, the inventive concepts relate to memory systems including nonvolatile memory and to read reclaim methods executed by memory systems including nonvolatile memory.

Semiconductor memories constitute a vital microelectronic component of digital logic system design, such as computers and microprocessor-based applications ranging from satellites to consumer electronics. Advances in the fabrication of semiconductor memories including process enhancements and technology developments through scaling for higher densities and faster operating speeds help establish performance standards for other digital logic families.

One category of semiconductor memory is volatile random access memory (RAM). In volatile RAM devices, logic information is typically stored either by setting up the logic state of a bistable flip-flop such as in a static random access memory (SRAM), or through the charging of a capacitor as in a dynamic random access memory (DRAM). In either case, the devices are considered volatile in that stored data is lost if the supply of power thereto is interrupted.

Another category of semiconductor memory is non-volatile memory which retains stored data even when the supply of power is interrupted. Examples include Mask Read-Only Memory (MROM), Programmable Read-Only Memory (PROM), Erasable Programmable Read-Only Memory (EPROM), and Electrically Erasable Programmable Read-Only Memory (EEPROM). The data stored in non-volatile memory may be permanent or reprogrammable, depending upon the fabrication technology used. In addition, non-volatile memories may be used for program and microcode storage in a wide variety of applications in the computer, avionics, telecommunications, and consumer electronics industries. A combination of single-chip volatile and non-volatile memory storage modes is also available in devices such as non-volatile SRAM (nvSRAM) for use in systems that require fast, programmable non-volatile memory. In addition, dozens of special memory architectures have evolved which contain additional logic circuitry to optimize their performance for application-specific tasks.

Among the previous given examples of non-volatile memory, MROM, PROM, and EPROM are not capable of being erased and then written to by a corresponding system itself, and it is thus difficult or impossible for general users to update stored contents. On the other hand, EEPROM is capable of being electrically erased and then written at a system level. Applications of EEPROM have therefore expanded to auxiliary memory and system programming where continuous updates are needed. An example of this is the widely adopted flash memory.

SUMMARY

One aspect of embodiments of the inventive concept is directed to provide a memory system which includes a nonvolatile memory device including a first memory area formed of memory blocks which store n-bit data per cell and a second memory area formed of memory blocks which store m-bit data per cell, where n and m are different integers, and a memory controller configured to control the nonvolatile memory device. The memory controller is configured to execute a read operation, and to execute a read reclaim operation in which valid data of a target memory block of the second memory area is transferred to one or more memory blocks of the first memory area, the target memory block selected during the read operation. The read reclaim operation is processed as complete when all the valid data of the target memory block is transferred to the one or more memory blocks of the first memory area.

Another aspect of embodiments of the inventive concept is directed to provide a read reclaim method of a memory controller which controls a nonvolatile memory device including first memory blocks which store n-bit data per cell and second memory blocks which store m-bit data per cell, where n and m are different integers. The method includes identifying a memory block among the second memory blocks as a target of a read reclaim operation, and executing the read reclaim operation by transferring valid data of the memory block identified as a target of the read reclaim operation to one or more memory blocks among the first memory blocks. The read reclaim operation is processed as complete when all the valid data is transferred to the one or more memory blocks among the first memory blocks.

Still another aspect of embodiments of the inventive concept is directed to provide an operating method of a memory controller which controls a nonvolatile memory device including first memory blocks which store n-bit data per cell and second memory blocks which store m-bit data per cell, where n and m are different integers. The method includes storing queue information indicating that a second memory block is a target memory block of a read reclaim operation when an error of data read from the second memory block exceeds a reference, and upon a host request, determining whether the target memory block exists based on the queue information. The method further includes programming valid data of the target memory block in at least one or more memory blocks among the first memory blocks when the target memory block is determined to exist, and programming data stored at the at least one or more memory blocks among the first memory blocks in a memory block among the second memory blocks at a garbage collection operation. The read reclaim operation is processed as completed when all the valid data of the target memory block is programmed in the at least one or more memory blocks among the first memory blocks.

BRIEF DESCRIPTION OF THE FIGURES

The above and other objects and features will become apparent from the detailed description that follows, with reference to the accompanying figures, wherein like reference numerals refer to like parts throughout the various figures unless otherwise specified.

FIG. 7 is a flow chart illustrating a read method of a memory system according to an embodiment of the inventive concept.

DETAILED DESCRIPTION

Figure 1:
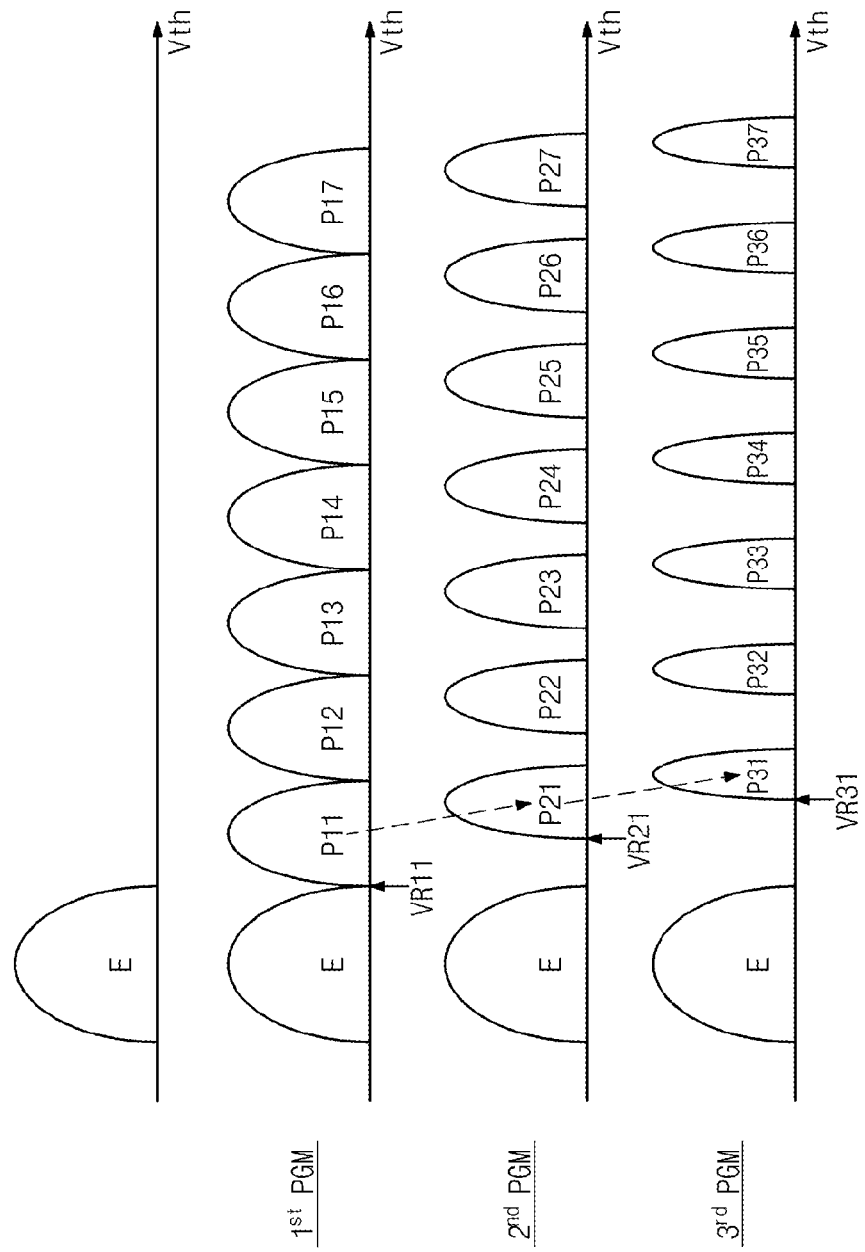
FIG. 1 is a diagram schematically illustrating a program operation executed in a reprogramming technique according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As the number of data bits stored at each memory cell increases (or, as the number of pages (or, page data) corresponding to each word line increases), various programming techniques may have been proposed. For example, an on-chip buffer program method may be applied to a memory system including a multi-bit memory device. It is possible to reduce a size of a buffer memory included in a memory controller of the memory system by using the on-chip buffer program method. The on-chip buffer program method may include programming data temporarily stored at the buffer memory of the memory controller at a first memory area of a multi-bit memory device and programming data stored at the first memory area of the multi-bit memory device at a second memory area of the multi-bit memory device. Programming data temporarily stored at the buffer memory at the first memory area of the multi-bit memory device may be referred to as a buffer program operation, and programming data stored at the first memory area of the multi-bit memory device at the second memory area of the multi-bit memory device may be referred to as a main program operation. That is, the on-chip buffer program method may include a buffer program operation and a main program operation. The multi-bit memory device may further comprise other memory areas other than the first and second memory areas.

In example embodiments, the buffer program operation may be performed when data corresponding to a minimum program unit of the first memory area is gathered at the buffer memory of the memory controller. The main program operation may be performed when data corresponding to a minimum program unit of the second memory area is gathered at the first memory area of the multi-bit memory device or when a usable storage space of the first memory area is insufficient. Herein, data corresponding to the minimum program unit of the first memory area may be a page of data, and data corresponding to the minimum program unit of the second memory area may be plural pages of data. The number of pages constituting the plural pages may be decided according to a bits-per-cell number. For example, in the event that a bits-per-cell number is 3 (i.e., 3 bits of data are stored in each cell), data corresponding to the minimum program unit of the second memory area may be 3-page data. It is understood that the minimum program units of the first and second memory areas are not limited to this disclosure. With the above description, data of the buffer memory may be programmed at the first memory area of the multi-bit memory device whenever data corresponding to the minimum program unit of the first memory area is gathered at the buffer memory. Thus, it is possible to reduce a size of the buffer memory.

In a memory system adopting the on-chip buffer program method, the main program operation may be performed using various programming techniques. For example, the main program operation may be carried out according to a reprogramming technique. Below, the main program operation using the reprogramming technique will be more fully described with reference to FIG. 1.

FIG. 1 is a diagram schematically illustrating a program operation executed in accordance with a reprogramming technique according to an embodiment of the inventive concept. Referring to FIG. 1, there is illustrated an example in which 3-bit data (or, 3-page data formed of LSB page data, CSB page data, and MSB page data) is programmed according to a reprogramming technique. However, 3-bit data is merely given as an example, and the reprogramming technique is not limited to 3-bit data.

In the example of FIG. 1, the reprogramming technique may include first programming, second programming and third programming, which will be more fully described.

At the first programming, respective memory cells may be maintained in an erase state E or programmed from the erase state E to one of program states E and P11 to P17. Herein, the eight states E and P11 to P17, as illustrated in FIG. 1, may be adjacent to one another without read margin interposed therebetween. That is, 3-bit data may be considered as being roughly programmed at the first programming. The 3-bit data may be data programmed at a first memory area via a buffer program operation, and may be read from the first memory area at the first programming.

In example embodiments, the first programming may be performed in accordance an Incremental Step Pulse Programming (ISPP) technique in which a program voltage is incremented at each iteration of a program loop.

In example embodiments, the first programming may include a verification operation. At the verification operation of the first programming, at least one program state may be verified. For example, at the first programming, even numbered program states P12, P14, and P16 may be verified, while odd number program states P11, P13, and P15, and P17 may not be verified. In other words, in this example, the first programming may be completed when the program states P12, P14, and P16 are verify-passed.

The second programming may be carried out to reprogram the 3-bit data programmed at the first programming, i.e., to reprogram the first programmed states P11 to P17 to states P21 to P27 having threshold voltage distributions of higher density. Here, the states P21 to P27, as illustrated in FIG. 1, may be adjacent to one another with predetermined read margin interposed therebetween. As described above, 3-bit data used at the second programming may be the same as that used at the first programming, and may be read from the first memory area. As illustrated in FIG. 1, the first-programmed state P11 may be reprogrammed to a state P21 at the second programming. As a result, a threshold voltage distribution corresponding to the state P21 may become narrower in width than that corresponding to the state P11. In other words, a verification voltage VR21 for verifying the second-programmed state P21 may be higher than a verification voltage VR11 for verifying the first-programmed state P11.

In example embodiments, the second programming may be executed according to the ISPP technique.

In example embodiments, the second programming may include a verification operation. All program states may be verified at a verification operation of the second programming That is, the second programming may be completed when all program states P21 to P27 are verify-passed.

The third programming may be carried out to reprogram the 3-bit data programmed at the second programming, i.e., to reprogram the second programmed states P21 to P27 to denser states P31 to P37. Herein, the states P31 to P37, as illustrated in FIG. 1, may be adjacent to one another with a predetermined read margin interposed therebetween which is larger than that of the second programming. As described above, 3-bit data used at the third programming may be equal to that used at the first/second programming, and may be read from the first memory area. As the third programming is executed, the second-programmed state P21 may be reprogrammed to a state P31 at the third programming. As a result, a threshold voltage distribution corresponding to the third-programmed state P31 may be narrower in width than that corresponding to the second-programmed state P21. In other words, a verification voltage VR31 for verifying the third-programmed state P31 may be higher than a verification voltage VR21 for verifying the second-programmed state P21.

In example embodiments, the third programming may be executed in accordance with the ISPP technique.

In example embodiments, all program states may be verified at a verification operation of the third programming That is, the third programming may be completed when all program states P31 to P37 are verify-passed.

As previously mentioned, the inventive concept is not limited to the example of 3-bit data being programmed at the first programming. The inventive concept is applicable to an example in which 2-bit data is programmed at the first programming After 2-bit data is first programmed, second programming may be executed to program 1-bit data. Afterwards, third programming may be performed to obtain target threshold voltage distributions. A related program technique is disclosed in U.S. Patent Publication No. 2011-0222342, the entire contents of which are hereby incorporated by reference.

A 3-bit program operation illustrated in FIG. 1 may be performed in a 3-step reprogramming technique. However, the inventive concept is not limited thereto. In the inventive concept, a program operation executed in a reprogramming technique may include three programming operations executed to narrow a threshold voltage distribution corresponding to a data value to be stored (in other words, to finely form a threshold voltage distribution).

Figure 2:
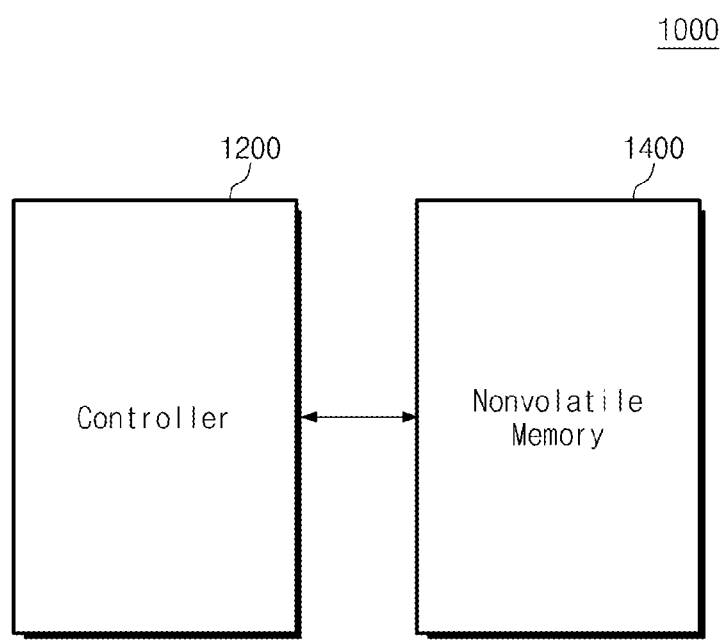
FIG. 2 is a block diagram schematically illustrating a memory system according to an embodiment of the inventive concept.

FIG. 2 is a block diagram schematically illustrating a memory system according to an embodiment of the inventive concept.

Referring to FIG. 2, a memory system 1000 according to an embodiment of the inventive concept may include a memory controller 1200 and a nonvolatile memory device 1400 as a multi-bit memory device. The memory controller 1200 may be configured to control the nonvolatile memory device 1400 according to an external request (e.g., a write request, a read request, etc). The memory controller 1200 may be configured to control the nonvolatile memory device 1400 according to an internal request (e.g., an operation associated with sudden power-off, a wear-leveling operation, a read reclaim operation, etc.) and without an external request. An operation corresponding to an internal request of the memory controller 1200 may be executed within a timeout period of a host after a host request is processed. Alternatively, an operation corresponding to an internal request of the memory controller 1200 may be executed within an idle time of the memory controller 1200. The nonvolatile memory device 1400 may operate responsive to the control of the memory controller 1200, and may be used as a type of storage medium which stores data information. The storage medium may be formed of one or more memory chips. The nonvolatile memory device 1400 may communicate with the memory controller 1200 via one or more channels. The nonvolatile memory device 1400 may include a NAND flash memory device, for example.

The memory system 1000 may use the above-described on-chip buffer program technique. As will be described later, the nonvolatile memory device 1400 may include a memory cell array having a first memory area and a second memory area. In example embodiments, a bits-per-cell number of the first memory area may be less than a bits-per-cell number of the second memory area. For example, the first memory area may be formed of memory blocks which store 1-bit data per cell, and the second memory area may be formed of memory blocks which store 3-bit data per cell. However, the bits-per-cell number of each of the first and second memory areas is not limited to this example. The memory controller 1200 may perform a read reclaim operation according to whether the number of error bits of data read from one of memory blocks in the second memory area exceeds a reference. With the read reclaim operation of the inventive concept, data stored at a memory block in the second memory area may be moved to memory blocks in the first memory area, and not to a memory block in the second memory area. In the case of the inventive concept, when data stored at a memory block in the second memory area is moved to memory blocks in the first memory area, a read reclaim operation associated with the memory block in the second memory area may be ended. This will be more fully described later.

Figure 3:
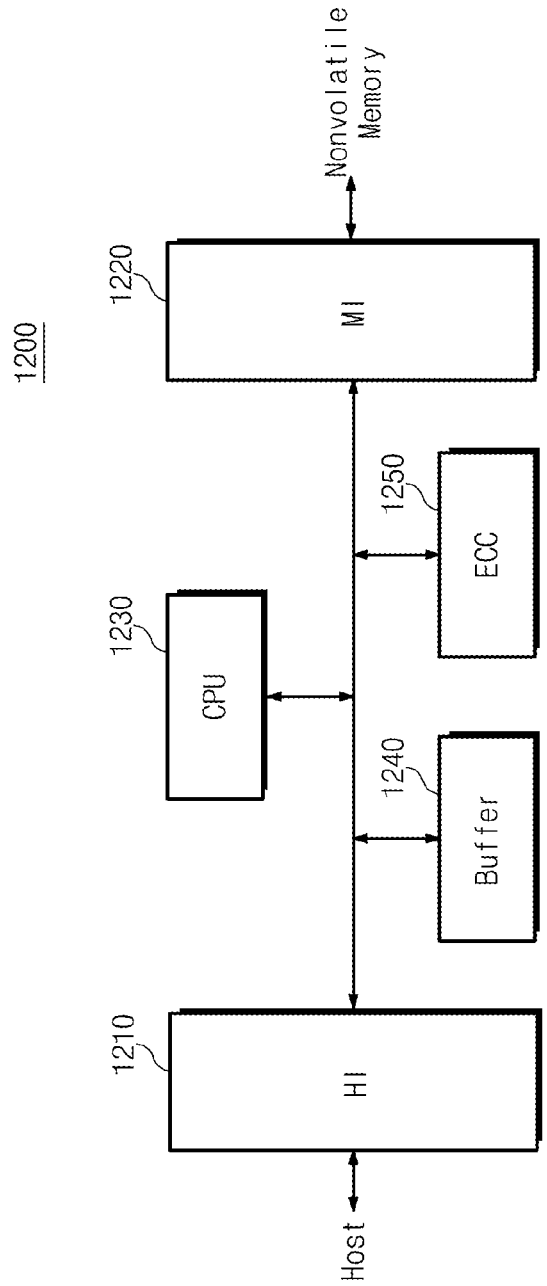
FIG. 3 is a block diagram schematically illustrating an example of a memory controller shown in FIG. 2.

FIG. 3 is a block diagram schematically illustrating an example of a memory controller shown in FIG. 2. Referring to FIG. 3, a memory controller 1200 may include a host interface 1210 as a first interface, a memory interface 1220 as a second interface, a CPU 1230, a buffer memory 1240, and an error detecting and correcting circuit (ECC) 1250.

The host interface 1210 may be configured to interface with an external device (for example, a host), and the memory interface 1220 may be configured to interface with a nonvolatile memory device 1400 illustrated in FIG. 2. The CPU 1230 may be configured to control an overall operation of the controller 1200. The CPU 1230 may be configured to operate firmware such as Flash Translation Layer (FTL), for example. The FTL may perform a variety of functions. For example, the FTL may include a variety of layers performing an address mapping operation, a read reclaim operation, an error correction operation, and so on. The buffer memory 1240 may be used to temporarily store data to be transferred from an external device via the host interface 1210 or data to be transferred from the nonvolatile memory device 1400 via the memory interface 1220. The buffer memory 1240 may be used to store information (e.g., information indicating source memory blocks needed for a read reclaim operation, address mapping information, etc.) necessary to control the nonvolatile memory device 1400.

The buffer memory 1240 may be formed of DRAM, SRAM, or a combination of DRAM and SRAM. However, the inventive concept is not limited thereto. The ECC 1250 may be configured to encode data to be stored in the nonvolatile memory device 1400 and to decode data read out from the nonvolatile memory device 1400.

Although not illustrated in figures, the memory controller 1200 may further include a randomizer/de-randomizer which is configured to randomize data to be stored in the nonvolatile memory device 1400 and to de-randomize data read from the nonvolatile memory device 1400. An example of a randomizer/de-randomizer is disclosed in U.S. Patent Publication No. 2010/0088574, the entire contents of which are hereby incorporated by reference.

In example embodiments, the host interface 1210 may be formed of one of computer bus standards, storage bus standards, and iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS- 422, IEEE-1284, UNI/O, 1-Wire, I2C, SPI, EIA/RS-485, USB, Camera Link, External PCIe, Light Peak, Multidrop Bus, and the like.

Figure 4:
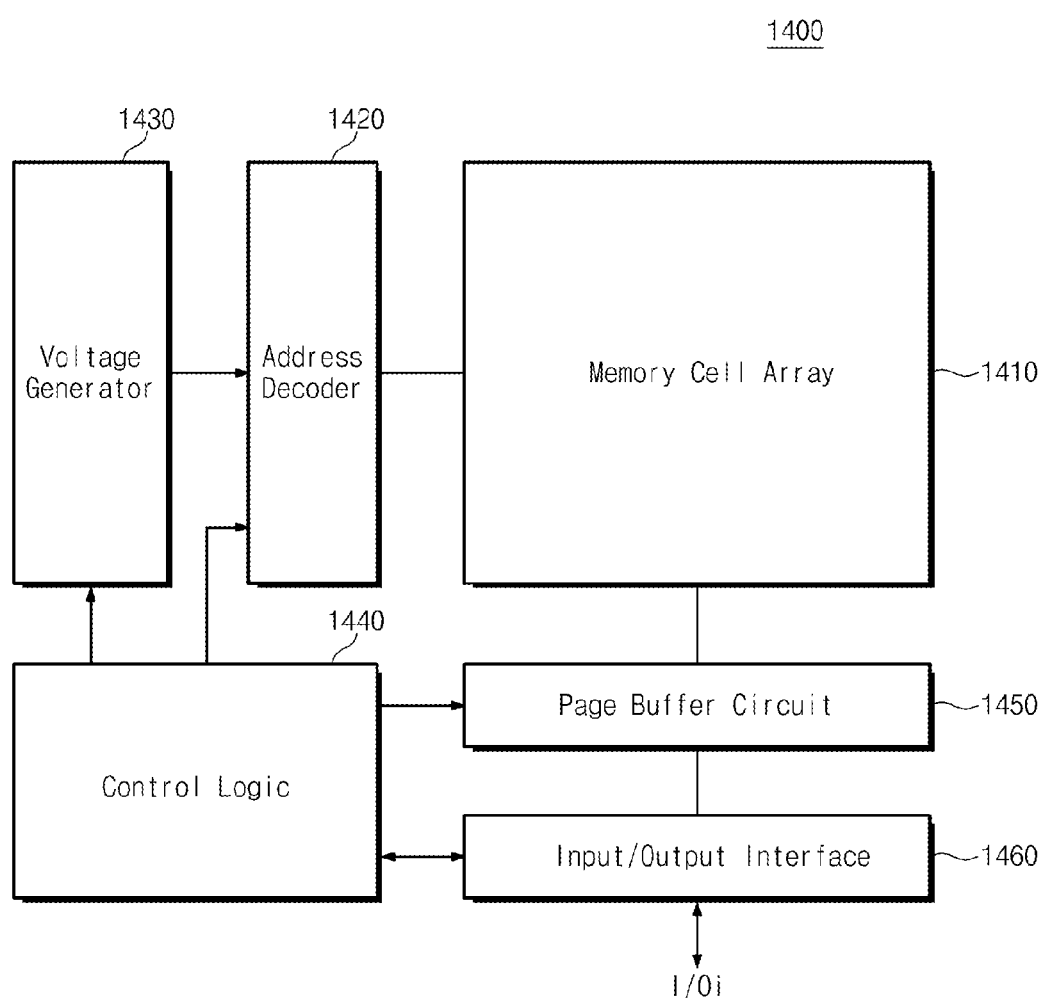
FIG. 4 is a block diagram schematically illustrating an example of a nonvolatile memory device shown in FIG. 2.

FIG. 4 is a block diagram schematically illustrating an example of a nonvolatile memory device shown in FIG. 2.

A nonvolatile memory device 1400 may be a NAND flash memory device, for example. However, it is understood that the nonvolatile memory device 1400 is not limited to the NAND flash memory device. For example, the inventive concept may be applied to a NOR flash memory device, a Resistive Random Access Memory (RRAM) device, a Phase-Change Memory (PRAM) device, a Magnetroresistive Random Access Memory (MRAM) device, a Ferroelectric Random Access Memory (FRAM) device, a Spin Transfer Torque Random Access Memory (STT-RAM), and the like. Further, the nonvolatile memory device 1400 can be implemented to have a three-dimensional array structure. An example of a nonvolatile memory device with the three-dimensional array structure may be referred to as a vertical NAND flash memory device. The inventive concept may be applied to a Charge Trap Flash (CTF) memory device including a charge storage layer formed of an insulation film as well as a flash memory device including a charge storage layer formed of a conductive floating gate.

Referring to FIG. 4, the nonvolatile memory device 1400 may include a memory cell array 1410, an address decoder 1420, a voltage generator 1430, control logic 1440, a page buffer circuit 14500, and an input/output interface 1460.

The memory cell array 1410 may include memory cells arranged at intersections of rows (e.g., word lines) and columns (e.g., bit lines). As an example, each memory cell may store 1-bit data or m-bit data as multi-bit data (m being an integer of 2 or more). The address decoder 1420 may be controlled by the control logic 1440, and may perform selecting and driving operations on rows (e.g., word lines, a string selection line(s), a ground selection line(s), a common source line, etc.) of the memory cell array 1410. The voltage generator 1430 may be controlled by the control logic 1440, and may generate voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420. The control logic 1440 may be configured to control an overall operation of the nonvolatile memory device 1400.

The page buffer circuit 1450 may be controlled by the control logic 1440, and may be configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input/output interface 1460 may be controlled by the control logic 1440, and may interface with an external device (e.g., a memory controller in FIG. 2). Although not illustrated in FIG. 4, the input/output interface 1460 may include a column decoder configured to select page buffers of the page buffer circuit 1450 by a predetermined unit, an input buffer receiving data, an output buffer outputting data, and so on.

Figure 5:
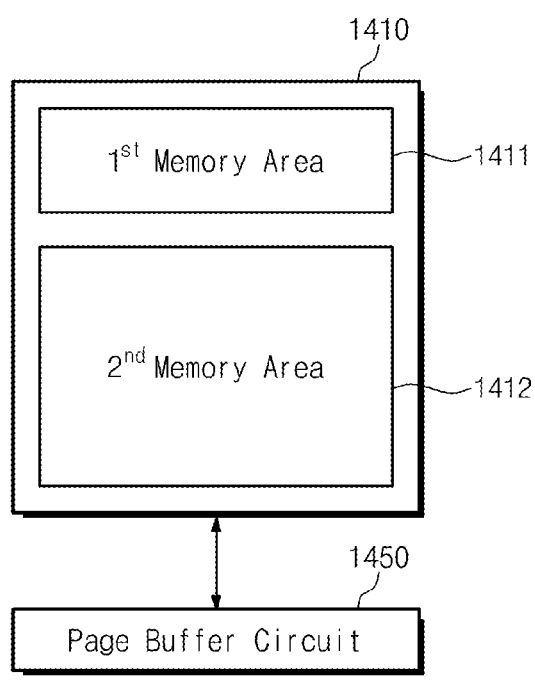
FIG. 5 is a block diagram schematically illustrating an example of a memory cell array shown in FIG. 4.

FIG. 5 is a block diagram schematically illustrating an example of a memory cell array shown in FIG. 4.

Referring to FIG. 5, a memory cell array 1410 may include a plurality of memory blocks, which are divided into a first memory area 1411 and a second memory area 1412. Herein, the division of the first and second memory areas 1411 and 1412 is made logically, rather than physically. Also, division of the first and second memory areas 1411 and 1412 can be changed logically. In other words, physical sizes of the first and second memory areas 1411 and 1412 can be changed logically under the control of a memory controller 1200. The first memory area 1411 is formed of memory blocks which store n-bit data per cell and the second memory area 1412 is formed of memory blocks which store m-bit data per cell, where n and m are integers. Also, memory blocks in the first memory area 1411 may be programmed in a manner different from memory blocks in the second memory area 1412, for example, n may be less than m. For example, memory blocks in the first memory area 1411 may be programmed according to a single-bit program technique (hereinafter, referred to as an SLC program technique), and memory blocks in the second memory area 1412 may be programmed according to a multi-bit program technique (hereinafter, referred to as an MLC/TLC program technique) (e.g., the above-described 3-step reprogramming technique). In other words, each memory cell in the first memory area 1411 may store 1-bit data (n=1), while each memory cell in the second memory area 1412 may store m-bit data (m being an integer of 2 or more). The number of data bits stored at each of memory cells in the first memory area 1411 may be less that that stored at each of memory cells in the second memory area 1412. Herein, it is understood that each memory cell in the first memory area 1411 is not limited to store 1-bit data.

As described above, data provided from a memory controller 1200 may be programmed at the first memory area 1411 via a buffer program operation. Data for a main program operation may be read out from the first memory area 1411, and the read data may be programmed at the second memory area 1412 via the main program operation.

FIGS. 6A to 6D are diagrams for describing various combinations of first and second memory areas of a multi-bit memory device according to an embodiment of the inventive concept. In figures, "BP" indicates buffer programming on a first memory area 1411, and "MP" indicates main programming on a second memory area 1412.

As described above, a multi-bit memory device 1400 includes the first memory area 1411 and the second memory area 1412. Herein, the first and second memory areas 1411 and 1412 may constitute a memory cell array of the multi-bit memory device 1400. Although not illustrated in figures, the memory cell array may further include areas such as a meta area, a reserved area, and so on. It is understood that areas of the memory cell array may be divided logically, not physically. This means that such areas of the memory cell array may be defined according to address mapping of a memory controller 1200.

Figure 6A:
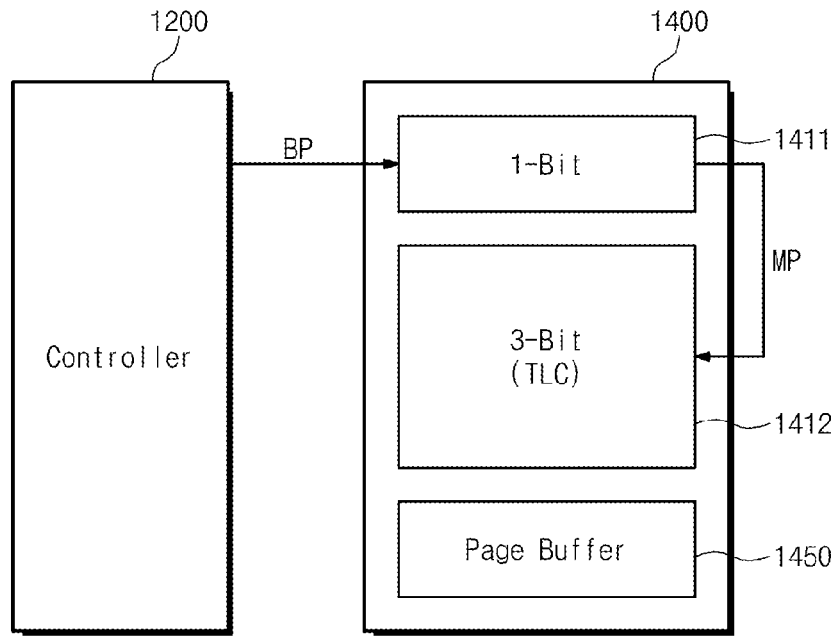
FIGS. 6A to 6D are diagrams for describing various implementations of first and second memory areas of a multi-bit memory device according to embodiments of the inventive concept.

Referring to FIG. 6A, in the case of a multi-bit memory device which stores 3-bit data per cell, the first memory area 1411 may be formed of memory cells each storing 1-bit data, and the second memory area 1412 may be formed of memory cells each storing 3-bit data. In this case, buffer programming may be executed according to an SLC program technique, and main programming may be made according to the above-described MLC program technique.

Figure 6B:
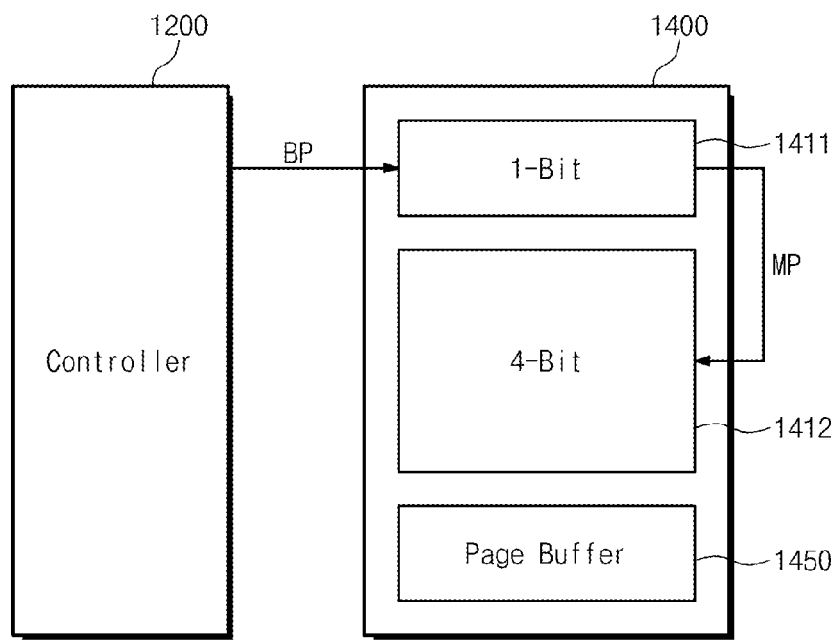

Referring to FIG. 6B, in the case of a multi-bit memory device which stores 4-bit data per cell, the first memory area 1411 may be formed of memory cells each storing 1-bit data, and the second memory area 1412 may be formed of memory cells each storing 4-bit data. In this case, buffer programming may be executed according to an SLC program technique, and main programming may be made according to the above-described MLC/TLC program technique.

Figure 6C:
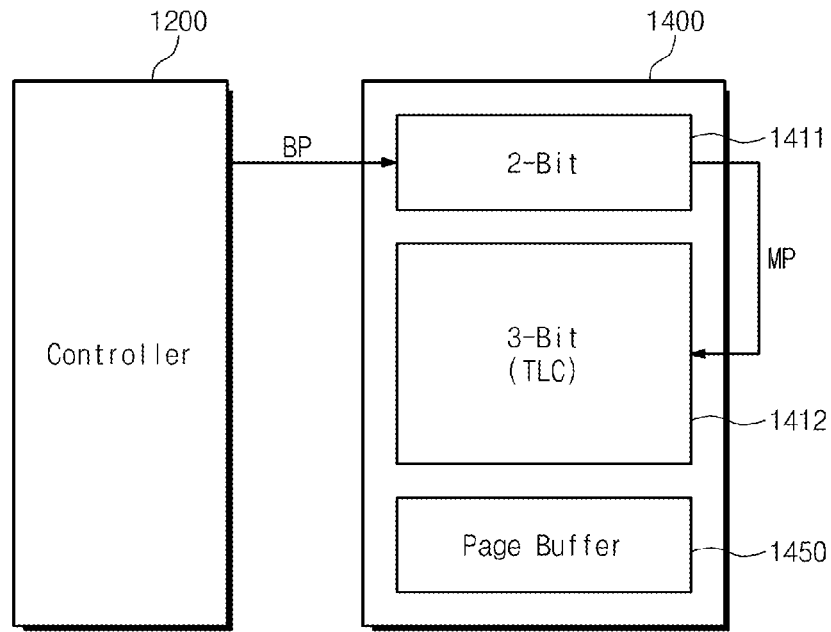

Referring to FIG. 6C, in the case of a multi-bit memory device which stores 3-bit data per cell, the first memory area

1411 may be formed of memory cells each storing 2-bit data, and the second memory area 1412 may be formed of memory cells each storing 3-bit data. In this case, buffer programming may be executed according to the above-described or conventional MLC program technique, and main programming may be made according to the above-described MLC/TLC program technique (e.g., a reprogram technique).

Figure 6D:
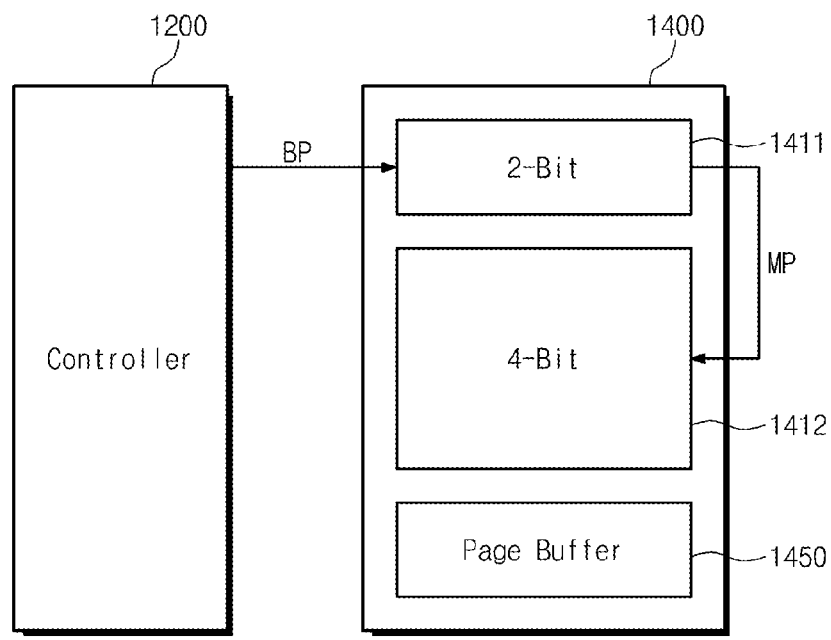

Referring to FIG. 6D, in the case of a multi-bit memory device which stores 4-bit data per cell, the first memory area 1411 may be formed of memory cells each storing 2-bit data, and the second memory area 1412 may be formed of memory cells each storing 4-bit data. In this case, buffer programming may be executed according to the above-described or conventional MLC program technique, and main programming may be made according to the above-described MLC/TLC program technique (e.g., a reprogram technique).

In exemplary embodiments, it is understood that defining of the first and second memory areas 1411 and 1412 illustrated in FIGS. 6A to 6D is not limited to these examples. For example, if storage medium included in a memory system is formed of a plurality of multi-bit memory devices, the first and second memory areas 1411 and 1412 can be defined with respect to the respective multi-bit memory devices. Alternatively, each of memory cell arrays of one or more multi-bit memory device may be defined as the first memory area 1411. Each of memory cell arrays of the remaining multi-bit memory devices may be defined as the second memory area 1412.

FIG. 7 is a flow chart illustrating a read method of a memory system according to an embodiment of the inventive concept. In the description that follows, an example is given in which a first memory area 1411 is formed of memory blocks (hereinafter, referred to as SLC blocks) which store 1-bit data per cell and a second memory area 1412 is formed of memory blocks (hereinafter, referred to as TLC blocks) which store 3-bit data per cell.

Referring to FIGS. 3, 6A and 7, in operation S110, a memory controller 1200 may receive a read request from an external device (e.g., a host). In operation S120, the memory controller 1200 may control a nonvolatile memory device 1400 such that read requested data is output. The read requested data may be data stored at a TLC block of a second memory area 1412, for example. Alternatively, the read requested data may be data stored at an SLC block of a first memory area 1411. In the example of this embodiment, the read requested data is data stored at a TLC block of the second memory area 1412.

In operation S130, while data output from the nonvolatile memory device 1400 is transferred to a buffer memory 1240 of the memory controller 1200, an ECC circuit 1250 of the memory controller 1200 may perform an error detecting operation on data output from the nonvolatile memory device 1400. At this time, the data output from the nonvolatile memory device 1400 may be temporarily stored at the buffer memory 1240 of the memory controller 1200.

In operation S140, whether an error contained in data output from the nonvolatile memory device 1400 is correctable by the ECC circuit 1250 may be determined. If the error is correctable by the ECC circuit 1250, the method proceeds to operation S150. In operation S150, the error contained in the data output from the nonvolatile memory device 1400 may be corrected byte the ECC circuit 1250 to obtain corrected data. In operation S160, the corrected data may be stored at the buffer memory 1240 and sent to the external device as the read requested data. At this time, the read operation may be terminated.

Returning to operation S140, an error contained in data output from the nonvolatile memory device 1400 may be considered uncorrectable, for example, in the case where the number of error bits of the data output from the nonvolatile memory device 1400 exceeds a threshold (e.g., an allowable error bit number of the ECC circuit 1250). In the case of uncorrectable error at operation S140, the method proceeds to operation S170. In operation S170, the memory controller 1200 may use software to perform an error detecting and correcting operation on the data output from the nonvolatile memory device 1400. That is, even in the case where the number of error bits included in the data output from the nonvolatile memory device 1400 exceeds an allowable error bit number of the ECC circuit 1250, it may be possible to correct an error contained in the data output from the nonvolatile memory device 1400 using error detecting and correcting software of the memory controller 1200. For example, an error detecting and correcting operation may be performed by a flash translation layer (FTL). In operation S180, it may be determined whether the data output from the nonvolatile memory device 1400 has been corrected by software in operation S170.

If the data output from the nonvolatile memory device 1400 is determined not to be correctable by software, the method proceeds to operation S190. In operation S190, the memory controller 1200 may process the read operation requested by the external device as a read fail. For example, a read fail flag may be generated according to any of a variety of different procedures. At this time, the read method may be terminated.

On the other hand, if the data output from the nonvolatile memory device 1400 is determined to have been corrected by software in operation S170, the method proceeds to operation S200. In operation S200, the memory controller 1200 may send the corrected data stored at the buffer memory 1240 to the external device as the read requested data. At this time, under control of the CPU 1230, information may be stored in a queue indicating that the TLC block storing the read requested data is a memory block that necessitates a read reclaim operation. This will be more fully described later herein.

In example embodiments, the queue may be formed by a part of the buffer memory 1240, and information stored at the queue may be referenced by the CPU 1230. To the loss of the queue information due to a sudden power-off condition, information stored at the queue may also be periodically stored at the nonvolatile memory device 1400. A read reclaim operation on a TLC block may be performed based on information stored at the queue. This will be more fully described later herein.

Figure 8A:
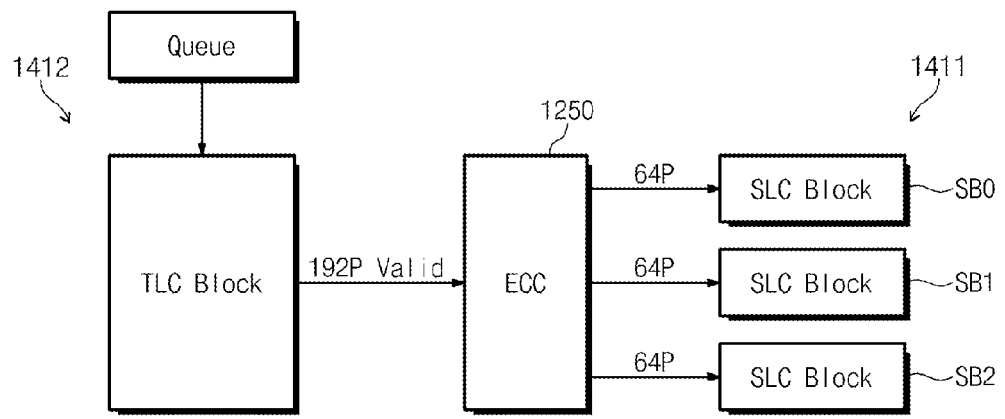
FIGS. 8A and 8B are diagrams illustrating a read reclaim operation according to an embodiment of the inventive concept.
Figure 8B:
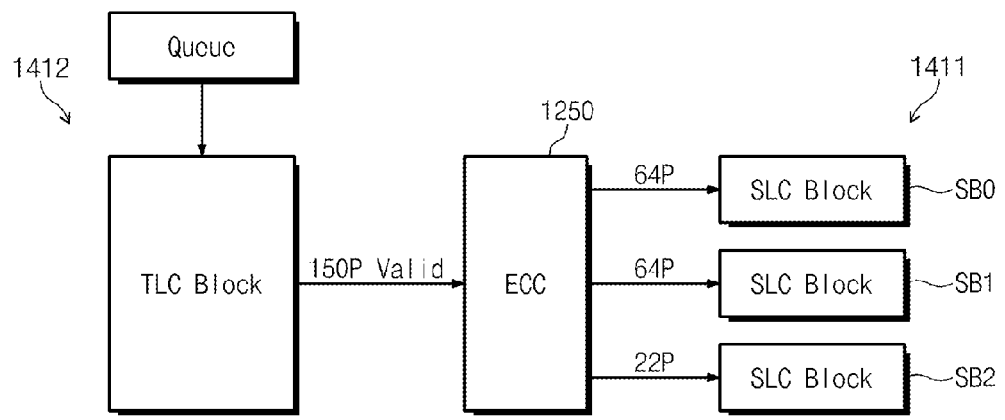

FIGS. 8A and 8B are diagrams for reference in describing a read reclaim operation according to an embodiment of the inventive concept.

For a variety of reasons, threshold voltage distributions of memory cells may be shifted from an ideal programmed distribution. For example, variations in temperature, multiple read operation iterations, and so on, can cause threshold voltage distribution to shift over time. This shift of threshold voltage distributions may cause an increase in the number of error bits contained within read data. This is particularly the case where read margins are low, such in the case of a TLC block which stores 3-bit data per cell. That is, the number of error bits caused by threshold voltage distributions may further increase multi-bit memory cells. Thus, a read reclaim operation may be performed to secure the integrity of read data. The read reclaim operation refers to an operation in which valid data of a TLC block including page data is moved to a new block. The page data may be determined to be uncorrectable and is thus moved to a new block, or the page data may be determined to have a high probability of a later increase in the number of error bits and is thus moved to a new block. The read reclaim operation may be performed because a shift of threshold voltage distributions of memory cells at which page data is stored affects adjacent memory cells.

Referring to FIG. 8A, a CPU 1230 may select a TLC block being a target block of a read reclaim operation of a flash translation layer FTL based on information stored at a queue. For example, it is assumed that a selected TLC block includes 64 word lines. Therefore, in the case of 3-bits-per-cell memory, 192 pages of data may be stored at one TLC block. In the case that 192 pages of data stored at the selected TLC block are all valid, there may be required three SLC blocks to move 192 pages of data stored at the selected TLC block. 64 pages of data may be read from a TLC block selected to perform a read reclaim operation, and the 64 pages of read data may be stored at one SLC block SB0 of a first memory area 1411 via an ECC circuit 1250 of a memory controller 1200. Then, 64 pages of data may be read from the selected TLC block for the read reclaim operation, and the 64 pages of read data may be stored at one SLC block SB1 of the first memory area 1411 via the ECC circuit 1250 of the memory controller 1200. Finally, 64 pages of data may be read from the selected TLC block for the read reclaim operation, and the 64 pages of read data may be stored at one SLC block SB2 of the first memory area 1411 via the ECC circuit 1250 of the memory controller 1200.

Referring to FIG. 8B, in the case that 150 pages of data of 192 pages of data stored at the selected TLC block are valid, there may be required three SLC blocks to move 150 pages of data stored at the selected TLC block. 64 pages of data may be read from a TLC block selected to perform a read reclaim operation, and the 64 pages of read data may be stored at one SLC block SB0 of the first memory area 1411 via the ECC circuit 1250 of the memory controller 1200. Then, 64 pages of data may be read from the selected TLC block for the read reclaim operation, and the 64 pages of read data may be stored at one SLC block SB1 of the first memory area 1411 via the ECC circuit 1250 of the memory controller 1200. Finally, 22 pages of data may be read from the selected TLC block for the read reclaim operation, and the 22 pages of read data may be stored at one SLC block SB2 of the first memory area 1411 via the ECC circuit 1250 of the memory controller 1200.

When all valid pages of data stored at a TLC block are moved to the first memory area 1411, the CPU 1230 may process the read reclaim operation of the FTL on the TLC block as being complete. For example, information (indicating a target block of a read reclaim operation) stored at the queue may be changed.

As described above, with the read reclaim operation of the inventive concept, valid pages of data of a TLC block being a target block of a read reclaim operation may be moved to SLC blocks of the first memory area 1411, and not to a TLC block of a second memory area 1412. If a transfer of data into SLC blocks of the first memory area 1411 is completed, a read reclaim operation on a TLC block may be processed as complete. In other words, at the read reclaim operation of the inventive concept, valid pages of data of a TLC block being a target block of a read reclaim operation may not be moved to a TLC block of the second memory block 1412.

In example embodiments, valid pages of data of a TLC block being a target block of a read reclaim operation may be moved to SLC blocks of the first memory area 1411 in a time division manner. For example, a part (e.g., valid pages of data corresponding to a size of an SLC block) of valid pages of data of a TLC block being a target block of a read reclaim operation may be moved to one SLC block. This may be performed within a host timeout period after a read or write operation is completed whenever the read or write operation is requested by a host. A read reclaim operation on a TLC block may be completed when all valid pages of data of a TLC block are moved to SLC blocks.

In example embodiments, the number of SLC blocks of the first memory area 1411 to which valid pages of data of a TLC block being a target block of a read reclaim operation is to be moved may be decided in view of a host timeout period. For example, a number of SLC blocks of the first memory area 1411 may be decided in view of the remaining time of the timeout period after a write request of a host is processed. Data of a TLC block being a target block of a read reclaim operation may be moved to SLC blocks decided at a write request of a host.

Data moved from a TLC block to SLC blocks may be stored at the second memory area 1412 via a main program operation. This operation may be performed at a garbage collection operation. This will be more fully described with reference to FIG. 9.

Figure 9:
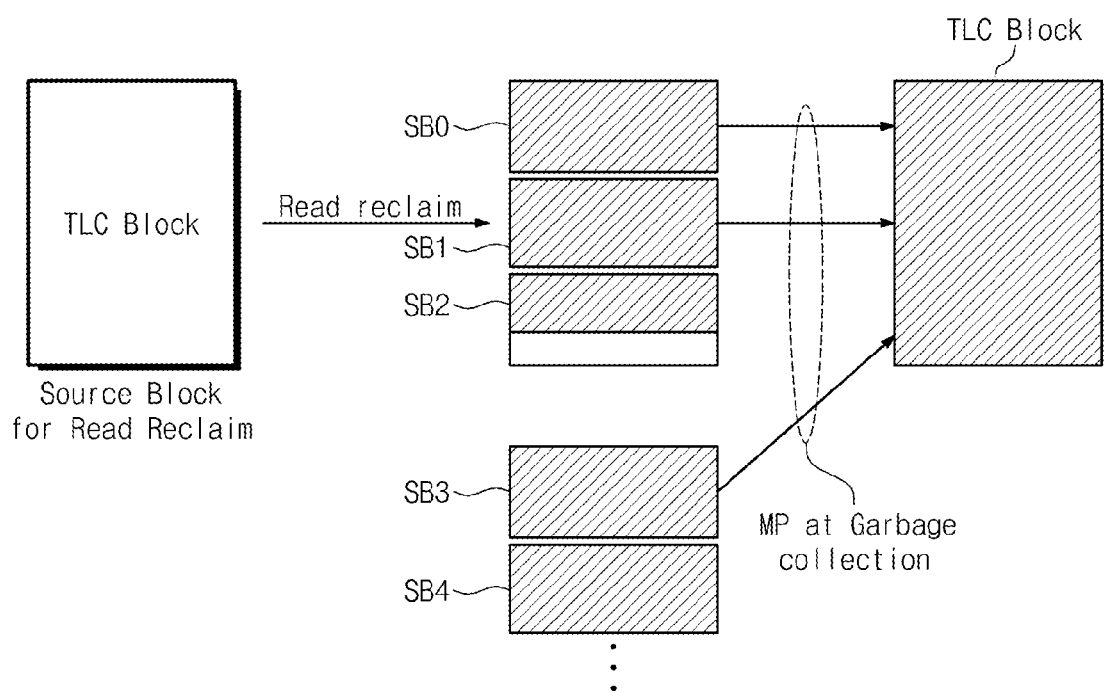
FIG. 9 is a diagram illustrating an example in which data of SLC blocks generated via a read reclaim operation is stored at a TLC block.

FIG. 9 is a diagram for reference in describing an example in which data of SLC blocks generated via a read reclaim operation is stored at a TLC block.

As described above, a read reclaim operation of the inventive concept may be completed when valid pages of data of a TLC block are moved to SLC blocks of a first memory area 1411. One of SLC blocks may include an empty storage space according to the number of valid pages of the TLC block. For example, Referring to FIGS. 8B and 9, in the case that 150 pages of data of 192 pages of data stored at a selected TLC block are valid, three SLC blocks may be required to move 150 pages of data stored at the selected TLC block, and one SLC block (e.g., SB2) may include an empty storage space. Data of the remaining SLC blocks SB0 and SB1 other than the SLC block SB2 including an empty storage space may be stored at a specific TLC block together with data of another SLC block (e.g., SB3) which is fully filled by data, at a garbage collection operation. If data of SLC blocks is stored at a TLC block in the above-described manner, a TLC block may be fully filled with data. In other words, all word lines of the TLC block may be closed. This may mean that the TLC block does not include an open word line. On the other hand, data of SLC blocks SB0, SB1, and SB2 at which 150 pages of data stored at a selected TLC block is stored is at a specific TLC block, an empty storage space may exist at the specific TLC block. This may mean that the specific TLC block includes an open word line.

Herein, in the case that 3-step reprogramming on memory cells connected with an nth word line WLn is completed and third programming of 3-step reprogramming on memory cells connected with an adjacent word line (e.g., WLn+1) is not performed, the nth word line WLn may be called an open word line. Target threshold voltage distributions of memory cells connected with an open word line may be formed when 3-step reprogramming on memory cells connected with an adjacent upper word line is completed. If 3-step reprogramming on memory cells connected with an adjacent upper word line is not completed, target threshold voltage distributions of memory cells connected with an open word line may not be formed normally. For example, memory cells connected with an open word line may insufficiently experience coupling caused by memory cells connected with an adjacent upper word line, so that target threshold voltage distributions of memory cells connected with the open word line are not formed normally. In this case, the probability that data read from memory cells connected with an open word line is uncorrectable may be increased.

Thus, it is possible to prevent an open word line from existing at a specific TLC block by storing data of the remaining SLC blocks SB0 and SB1 other than the SLC block SB2 including an empty storage space, at the specific TLC block together with data of another SLC block (e.g., SB3), which is fully filled by data, at a garbage collection operation.

In example embodiments, data of an SLC block (e.g., SB2) having an empty storage space may be moved to another SLC block or a TLC block together with data of another SLC block having an empty storage space.

Figure 10:
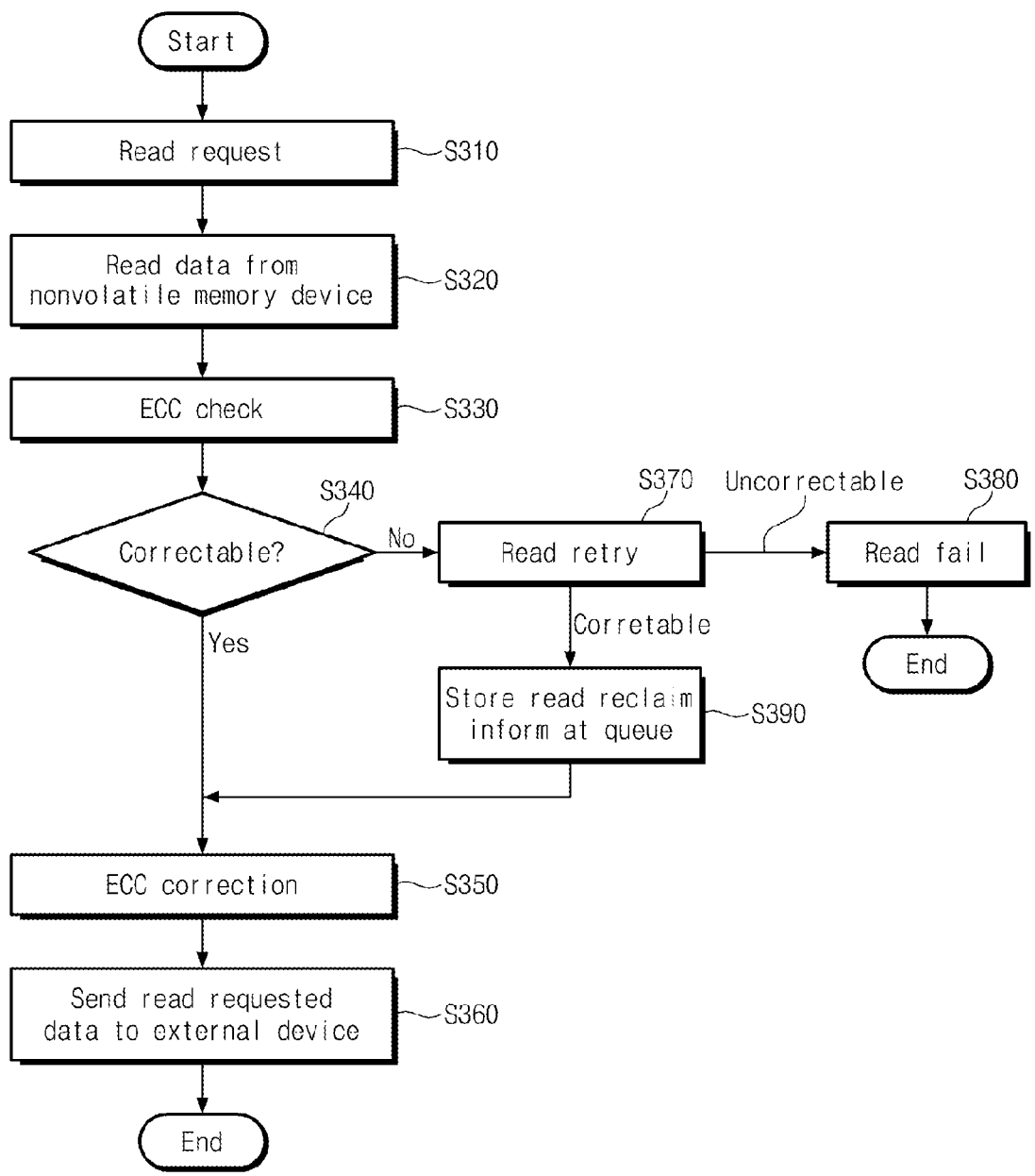
FIG. 10 is a flow chart illustrating a read method of a memory system according to another embodiment of the inventive concept.

FIG. 10 is a flow chart illustrating a read method of a memory system according to another embodiment of the inventive concept. Below, a read method of a memory system according to an embodiment of the inventive concept will be more fully described with reference to accompanying drawings. It is assumed by way of example that a first memory area 1411 is formed of memory blocks (hereinafter, referred to as SLC blocks) which store 1-bit data per cell and a second memory area 1412 is formed of memory blocks (hereinafter, referred to as TLC blocks) which store 3-bit data per cell.

In operation S310, a memory controller 1200 may receive a read request from an external device (e.g., a host). In operation S320, the memory controller 1200 may control a nonvolatile memory device 1400 such that read requested data is output. The read requested data may be data stored at a TLC block of a second memory area 1412, for example. Alternatively, the read requested data may be data stored at an SLC block of a first memory area 1411. In example embodiments, the read requested data may be data stored at a TLC block of the second memory area 1412.

In operation S330, while data output from the nonvolatile memory device 1400 is transferred to a buffer memory 1240 of the memory controller 1200, an ECC circuit 1250 of the memory controller 1200 may perform an error detecting operation on data output from the nonvolatile memory device 1400. At this time, the data output from the nonvolatile memory device 1400 may be temporarily stored at the buffer memory 1240 of the memory controller 1200.

In operation S340, whether an error of data output from the nonvolatile memory device 1400 is correctable may be determined. If so, the method proceeds to operation S350. In operation S350, an error of data output from the nonvolatile memory device 1400 may be corrected. In operation S360, corrected data stored at the buffer memory 1240 may be sent to the external device as the read requested data. Afterward, the read operation may be terminated.

Returning to S340, if data output from the nonvolatile memory device 1400 is uncorrectable or in the case that the number of error bits of the data output from the nonvolatile memory device 1400 exceeds a reference (e.g., an allowable error bit number of the ECC circuit 1250), the method proceeds to operation S370. In operation S370, a read retry operation may be performed. At the read retry operation, a read operation may be retried under a condition that a read voltage is varied within a predetermined number. An exemplary read retry operation is disclosed in U.S. Patent Publication No. 2010/0322007, the entire contents of which are hereby incorporated by reference. Whether data read whenever a read voltage is varied is correctable may be determined. In the case that data read via the read retry operation is uncorrectable, the method proceeds to operation S380. In operation S380, a read fail flag may be generated. A procedure according to generation of the read fail flag may be variously determined. Afterwards, the method may be ended.

In the case that data read via the read retry operation is correctable, the method proceeds to operation S390. In operation S390, information indicating that a TLC block of the second memory area 1412 at which data output from the nonvolatile memory device 1400 is stored is a target block of a read reclaim operation may be stored at a queue. As described above, the queue may be formed of a part of a buffer memory 1240, and information stored at the queue may be referred by a CPU 1230. The information stored at the queue may be stored at the nonvolatile memory device 1400 periodically or at a predetermined time. This may be performed to prevent information stored at the queue from being lost due to sudden power-off. A read reclaim operation on a TLC block may be performed based on information stored at the queue, which will be more fully described later herein.

After information indicating that a TLC block of the second memory area 1412 at which data output from the nonvolatile memory device 1400 is stored is a target block of a read reclaim operation is stored at the queue, the method proceeds to operation S350. In operation S350, an error of data output from the nonvolatile memory device 1400 may be corrected. In operation S360, corrected data stored at the buffer memory 1240 may be sent to the external device as the read requested data. Afterward, the read operation may be terminated.

The memory controller 1200 may perform a read reclaim operation based on information stored at the queue, which is performed the same as described with reference to FIGS. 8A, 8B, and 9.

Figure 11:
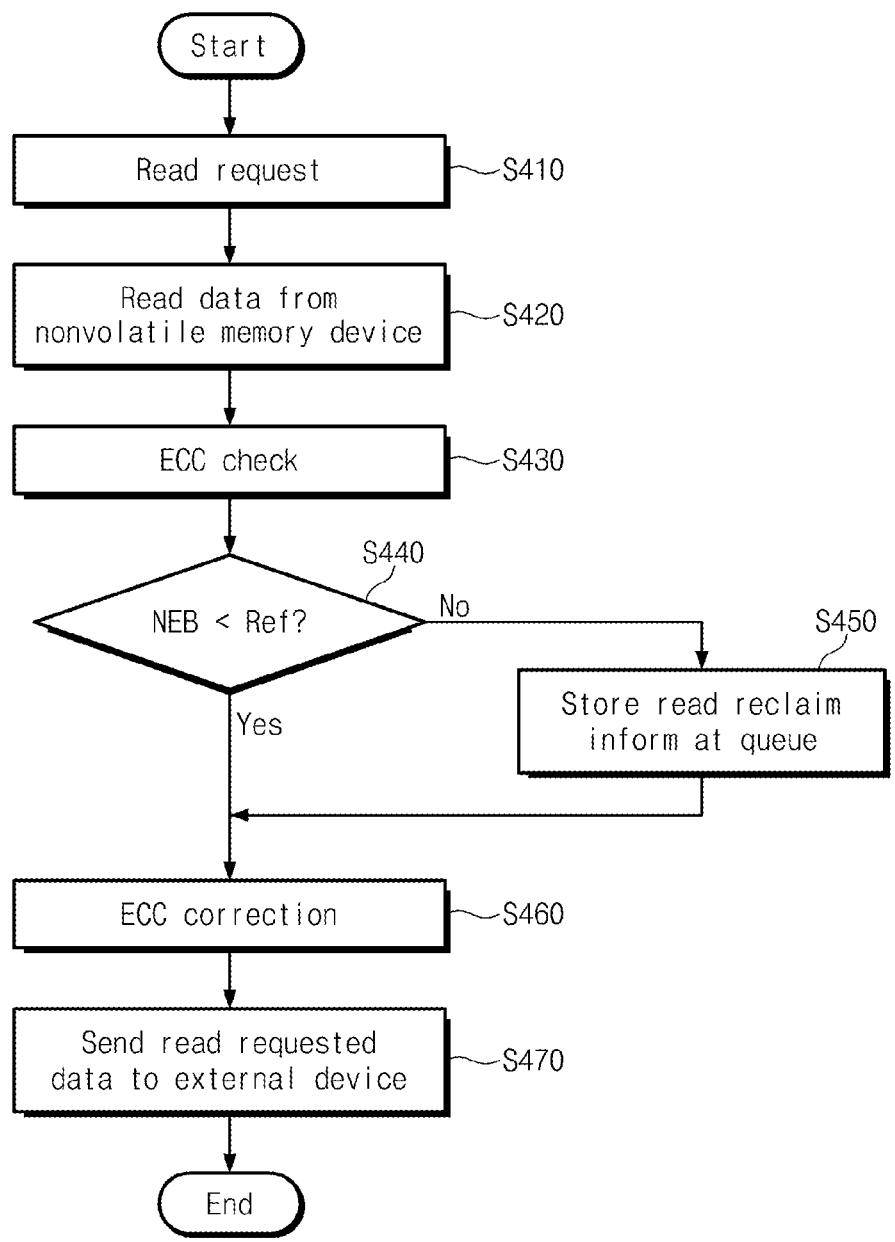
FIG. 11 is a flow chart illustrating a read method of a memory system according to still another embodiment of the inventive concept.

FIG. 11 is a flow chart illustrating a read method of a memory system according to still another embodiment of the inventive concept. Below, a read method of a memory system according to an embodiment of the inventive concept will be more fully described with reference to accompanying drawings. It is assumed as an example that a first memory area 1411 is formed of memory blocks (hereinafter, referred to as SLC blocks) which stores 1-bit data per cell and a second memory area 1412 is formed of memory blocks (hereinafter, referred to as TLC blocks) which stores 3-bit data per cell.

In operation S410, a memory controller 1200 may receive a read request from an external device (e.g., a host). In operation S420, the memory controller 1200 may control a nonvolatile memory device 1400 such that read requested data is output. The read requested data may be data stored at a TLC block of a second memory area 1412, for example. Alternatively, the read requested data may be data stored at an SLC block of a first memory area 1411. In example embodiments, the read requested data may be data stored at a TLC block of the second memory area 1412.

In operation S430, while data output from the nonvolatile memory device 1400 is transferred to a buffer memory 1240 of the memory controller 1200, an ECC circuit 1250 of the memory controller 1200 may perform an error detecting operation on data output from the nonvolatile memory device 1400. At this time, the data output from the nonvolatile memory device 1400 may be temporarily stored at the buffer memory 1240 of the memory controller 1200.

In operation S440, whether the number of error bits included in data output from the nonvolatile memory device 1400 is below a reference may be determined. Herein, the reference may be an allowable error bit number of an ECC circuit 1250, an error bit number less than the allowable error bit number, and so on. If the number of error bits included in data output from the nonvolatile memory device 1400 is over the reference, the method proceeds to operation S450. In operation S450, information indicating that a TLC block of the second memory area 1412 at which data output from the nonvolatile memory device 1400 is stored is a target block of a read reclaim operation may be stored at a queue. As described above, the queue may be formed of a part of a buffer memory 1240, and information stored at the queue may be referred by a CPU 1230. The information stored at the queue may be stored at the nonvolatile memory device 1400 periodically or at a predetermined time. This may be performed to prevent information stored at the queue from being lost due to sudden power-off. A read reclaim operation on a TLC block may be performed based on information stored at the queue, which will be more fully described later.

After information indicating that a TLC block of the second memory area 1412 at which data output from the nonvolatile memory device 1400 is stored is a target block of a read reclaim operation is stored at the queue, the method proceeds to operation S460. In operation S460, an error of data output from the nonvolatile memory device 1400 may be corrected. In operation S470, corrected data stored at the buffer memory 1240 may be sent to the external device as the read requested data. Afterward, the read operation may be terminated.

The memory controller 1200 may perform a read reclaim operation based on information stored at the queue, which is performed the same as described with reference to FIGS. 8A, 8B, and 9.

Figure 12:
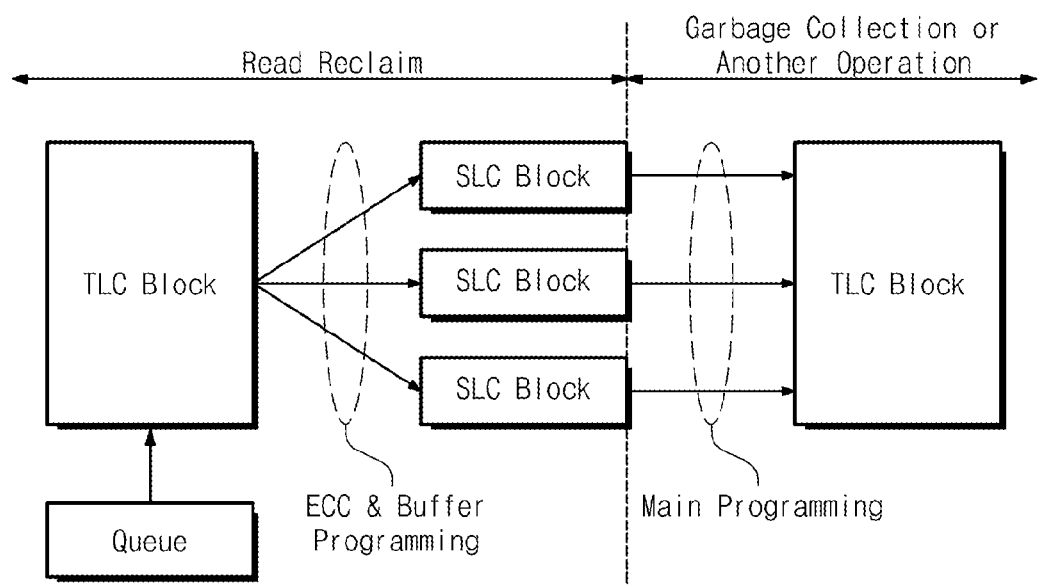
FIG. 12 is a block diagram schematically illustrating a read reclaim technique of a memory system according to an embodiment of the inventive concept.

FIG. 12 is a block diagram schematically illustrating a read reclaim technique of a memory system according to an embodiment of the inventive concept.

Referring to FIG. 12, a read reclaim operation may be an operation in which valid data of a TLC block including page data having the high read fail probability is moved to a new block, and may be performed to secure the integrity of data. In the case of the inventive concept, information indicating TLC blocks determined as a target block of a read reclaim operation may be stored at a queue. At a request (e.g., a write request) of a host, a requested operation may be completed, and a part (or all) of valid pages of data of a TLC block may be moved to an SLC block(s) according to information stored at the queue. A transfer of data to an SLC block may be performed via encoding of an ECC circuit 1250 and buffer programming.

In example embodiments, the amount of data to be transferred to an SLC block at a host request may be decided in view of a host timeout period. For example, the amount of data to be transferred to an SLC block may correspond to a storage capacity of one SLC block. Alternatively, the amount of data to be transferred to an SLC block may correspond to a sum of storage capacities of two SLC blocks. However, the inventive concept is not limited thereto. Thus, the requested operation and a transfer of data to an SLC block may be performed within a host timeout period.

If valid pages of data of a TLC block decided to be a target block of a read reclaim operation are all moved to SLC blocks, as understood from FIG. 12, a read reclaim operation associated with the TLC block may be processed to be completed. Afterwards, data stored at SLC blocks may be stored at a TLC block via a garbage collection operation or a main program operation at another operation, not via the read reclaim operation. As described with reference to FIG. 9, in the case that one of SLC blocks programmed via a read reclaim operation includes an empty storage space, data of the remaining SLC blocks other than the SLC block including an empty storage space may be stored at a TLC block via a main program operation together with data of another SLC block.

Thus, the read reclaim operation of the inventive concept may be performed over satisfying a host timeout condition.

Also, a memory system of the inventive concept may prevent an open word line from being generated at a TLC block.

Figure 13:
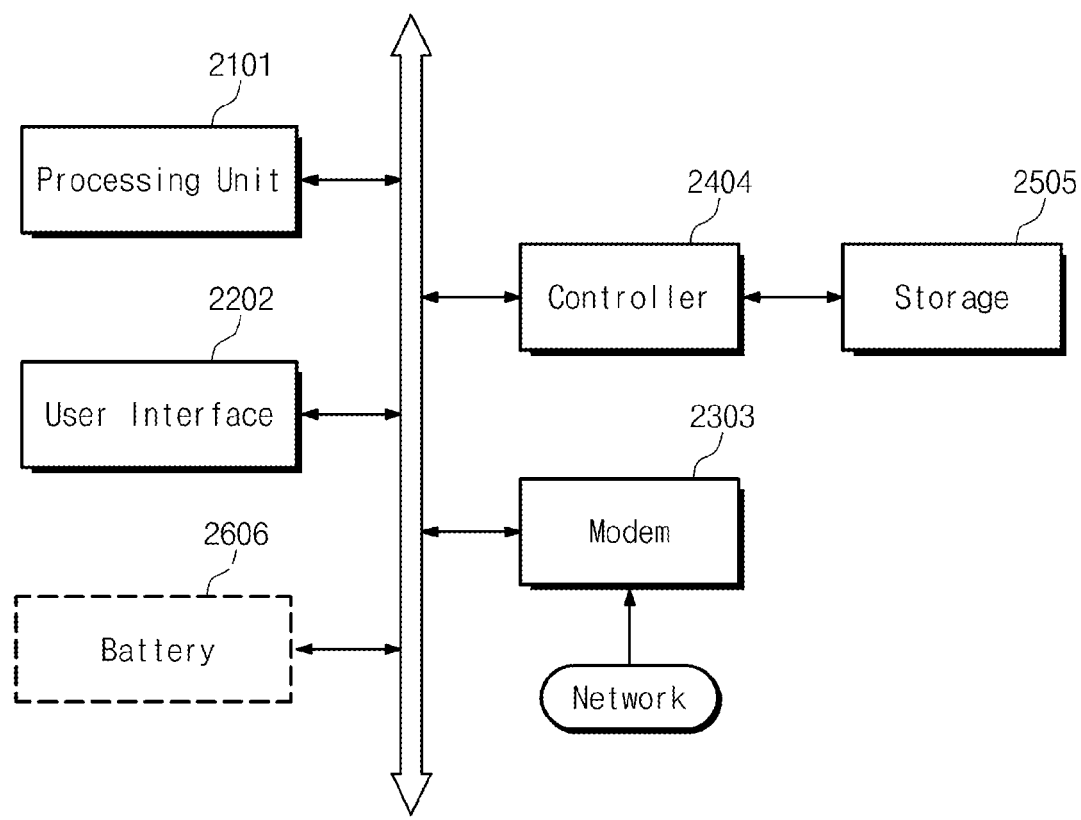
FIG. 13 is a block diagram schematically illustrating a computing system according to an embodiment of the inventive concept.

FIG. 13 is a block diagram schematically illustrating a computing system according to an embodiment of the inventive concept. A computing system may include a processing unit 2101, a user interface 2202, a modem 2303 such as a baseband chipset, a memory controller 2404, and storage medium 2505.

The memory controller 2404 may be configured substantially the same as illustrated in FIGS. 2 and 3, and the storage medium 2505 may be formed of a nonvolatile memory device illustrated in FIG. 4. For example, the memory controller 2404 may manage TLC blocks being a target block of a read reclaim operation, select a TLC block according to information stored at a queue at a specific time (e.g., at a write request of a host), and control the storage medium 2505 such that valid pages of data of the selected TLC block are moved to SLC blocks included in a nonvolatile memory device. The memory controller 2404 may process a read reclaim operation on the selected TLC block to be completed when valid pages of data of the selected TLC block are moved to SLC blocks included in a nonvolatile memory device.

N-bit data (N being 1 or more integer) processed/to be processed by the processing unit 2101 may be stored in the storage medium 2505 through the memory controller 2404. In the event that the computing system is a mobile device, a battery 2606 may be further included in the computing system to supply an operating voltage thereto. Although not illustrated in FIG. 13, the computing system may further comprise an application chipset, a camera image processor (CIS), a mobile DRAM, and the like.

Figure 14:
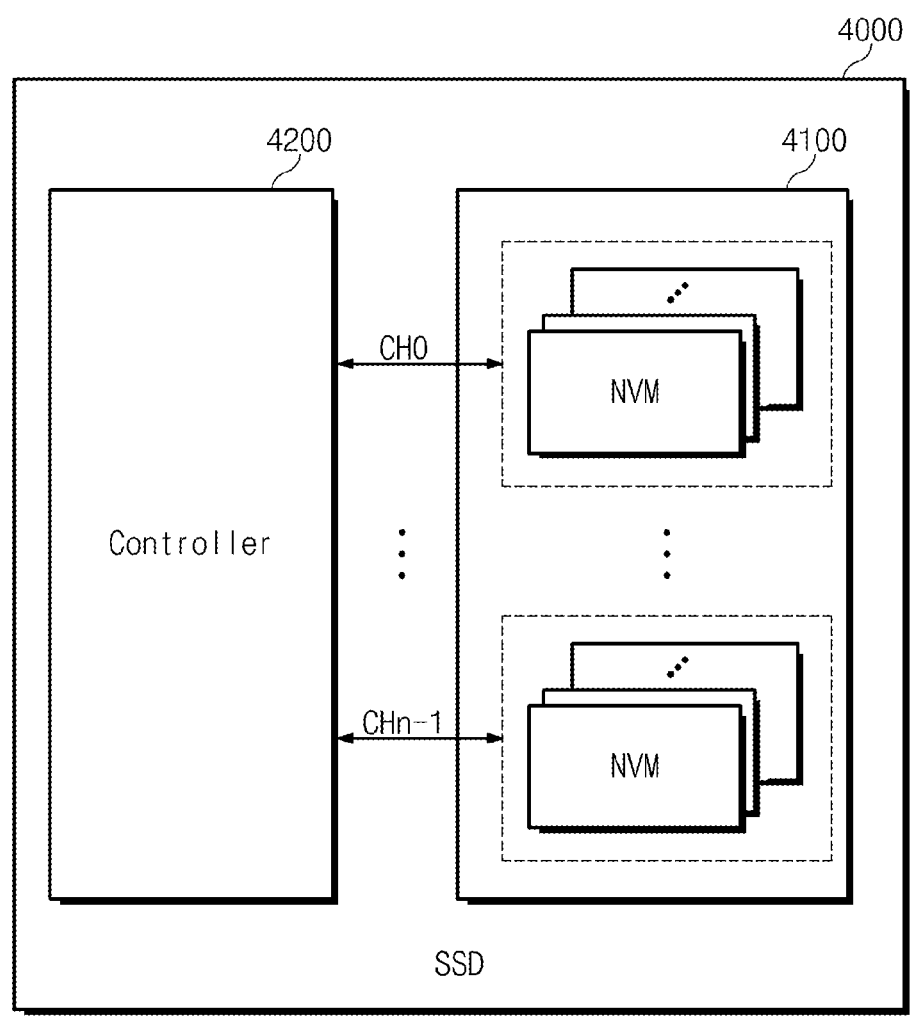
FIG. 14 is a block diagram schematically illustrating a solid state drive according to an embodiment of the inventive concept.

FIG. 14 is a block diagram schematically illustrating a solid state drive according to an embodiment of the inventive concept.

Referring to FIG. 14, a solid state drive (SSD) 4000 may comprise storage medium 4100 and a controller 4200. The storage medium 4100 may be connected with the controller 4200 via a plurality of channels, each of which is commonly connected with a plurality of nonvolatile memories. The controller 4200 may be configured substantially the same as illustrated in FIGS. 2 and 3, and each of nonvolatile memory devices in storage medium 4100 may be formed of a nonvolatile memory device illustrated in FIG. 4. For example, the controller 4200 may manage TLC blocks being a target block of a read reclaim operation, select a TLC block according to information stored at a queue at a specific time (e.g., at a write request of a host), and control the storage medium 4100 such that valid pages of data of the selected TLC block are moved to SLC blocks included in a nonvolatile memory device. The controller 4200 may process a read reclaim operation on the selected TLC block to be completed when valid pages of data of the selected TLC block are moved to SLC blocks included in a nonvolatile memory device.

Figure 15:
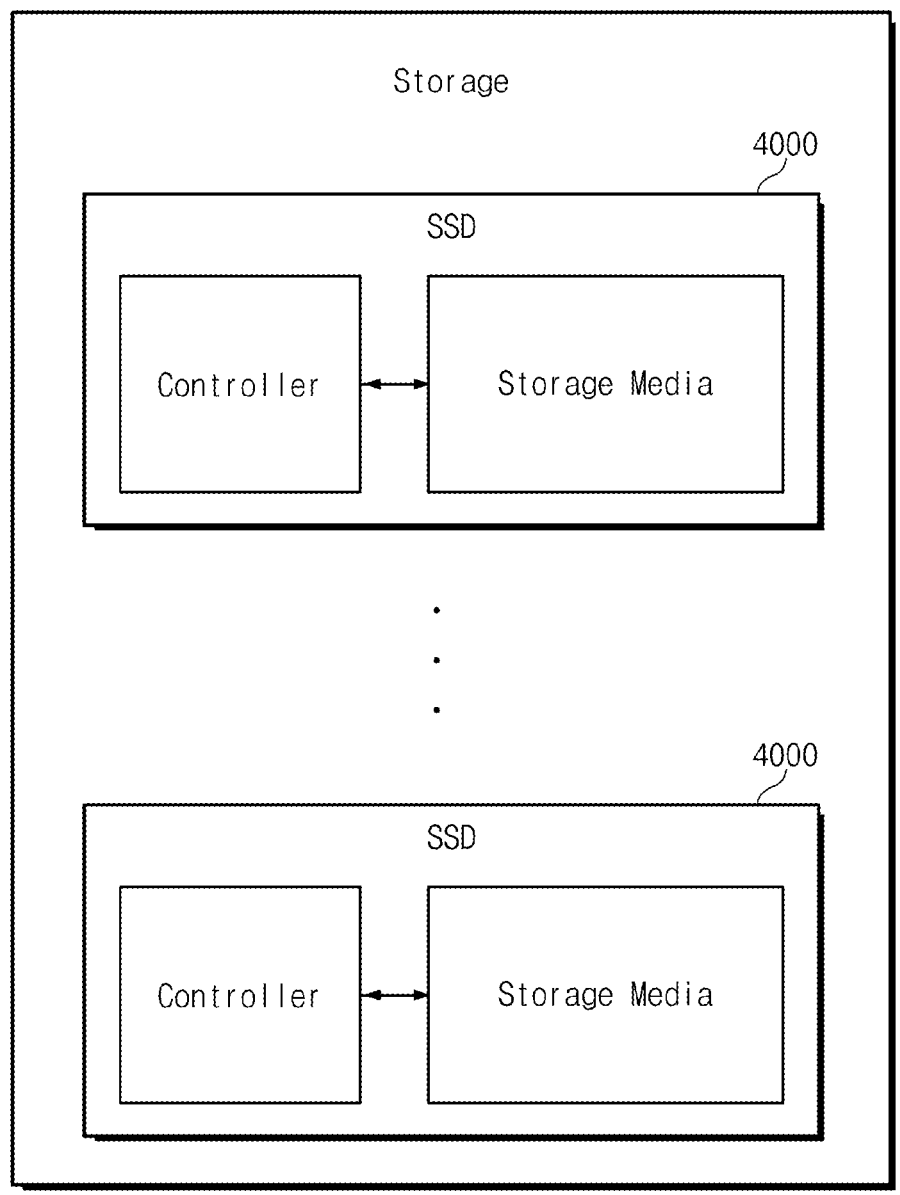
FIG. 15 is a block diagram schematically illustrating a storage system including a plurality of solid state drives shown in FIG. 14.
Figure 16:
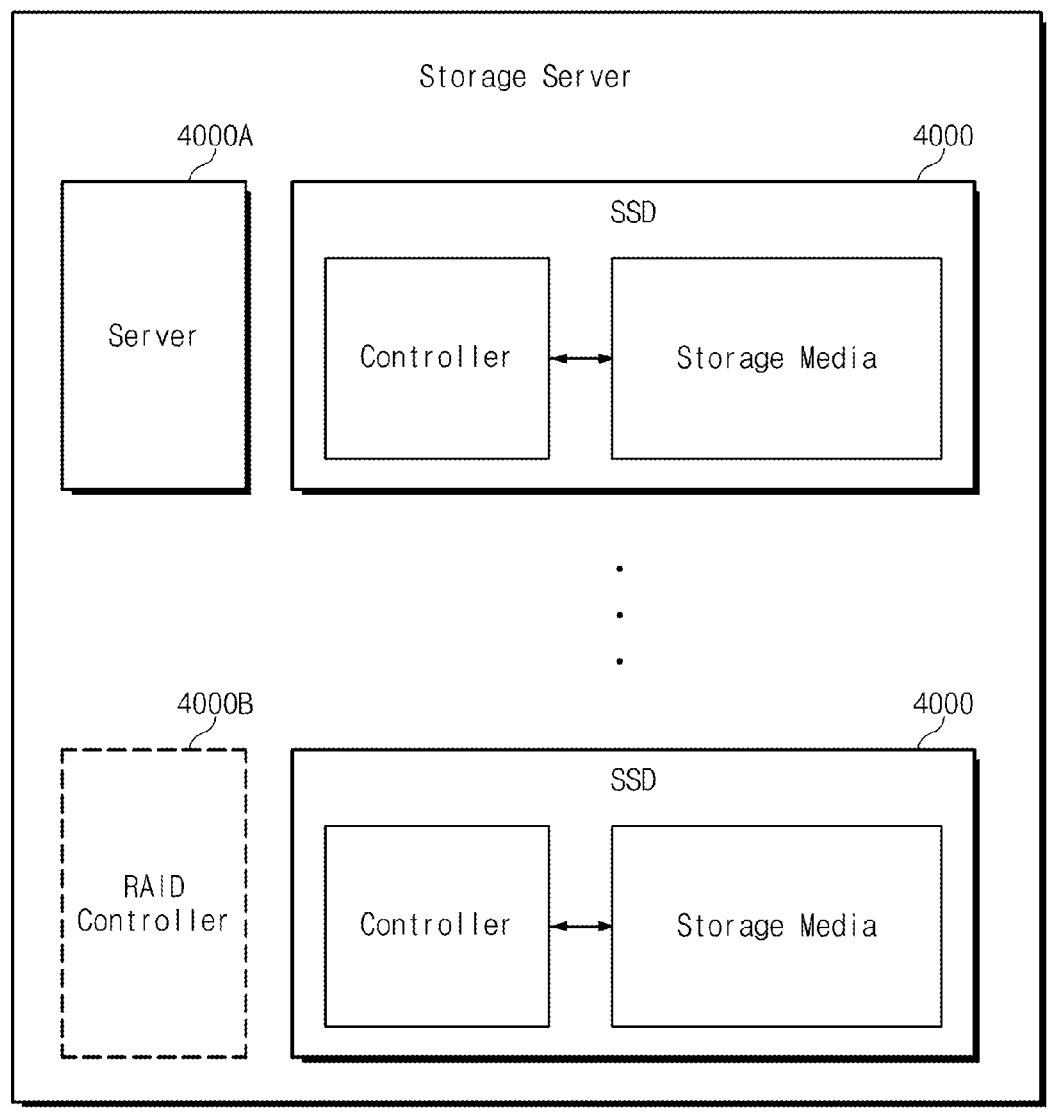
FIG. 16 is a block diagram schematically illustrating a storage server including a plurality of solid state drives shown in FIG. 14.

FIG. 15 is a block diagram schematically illustrating a storage using a solid state drive shown in FIG. 14, and FIG. 16 is a block diagram schematically illustrating a storage server using a solid state drive shown in FIG. 14.

An SSD 4000 according to an embodiment of the inventive concept may be used to form the storage. As illustrated in FIG. 15, the storage may include a plurality of solid state drives 4000 which are configured the same as described in FIG. 14. An SSD 4000 according to an embodiment of the inventive concept may be used to configure a storage sever. As illustrated in FIG. 16, a storage server includes a plurality of solid state drives 4000, which are configured the same as described in connection with FIG. 14, and a server 4000A.

Further, it is understood that a well-known RAID controller 4000B may be provided in the storage server.

Figure 17:
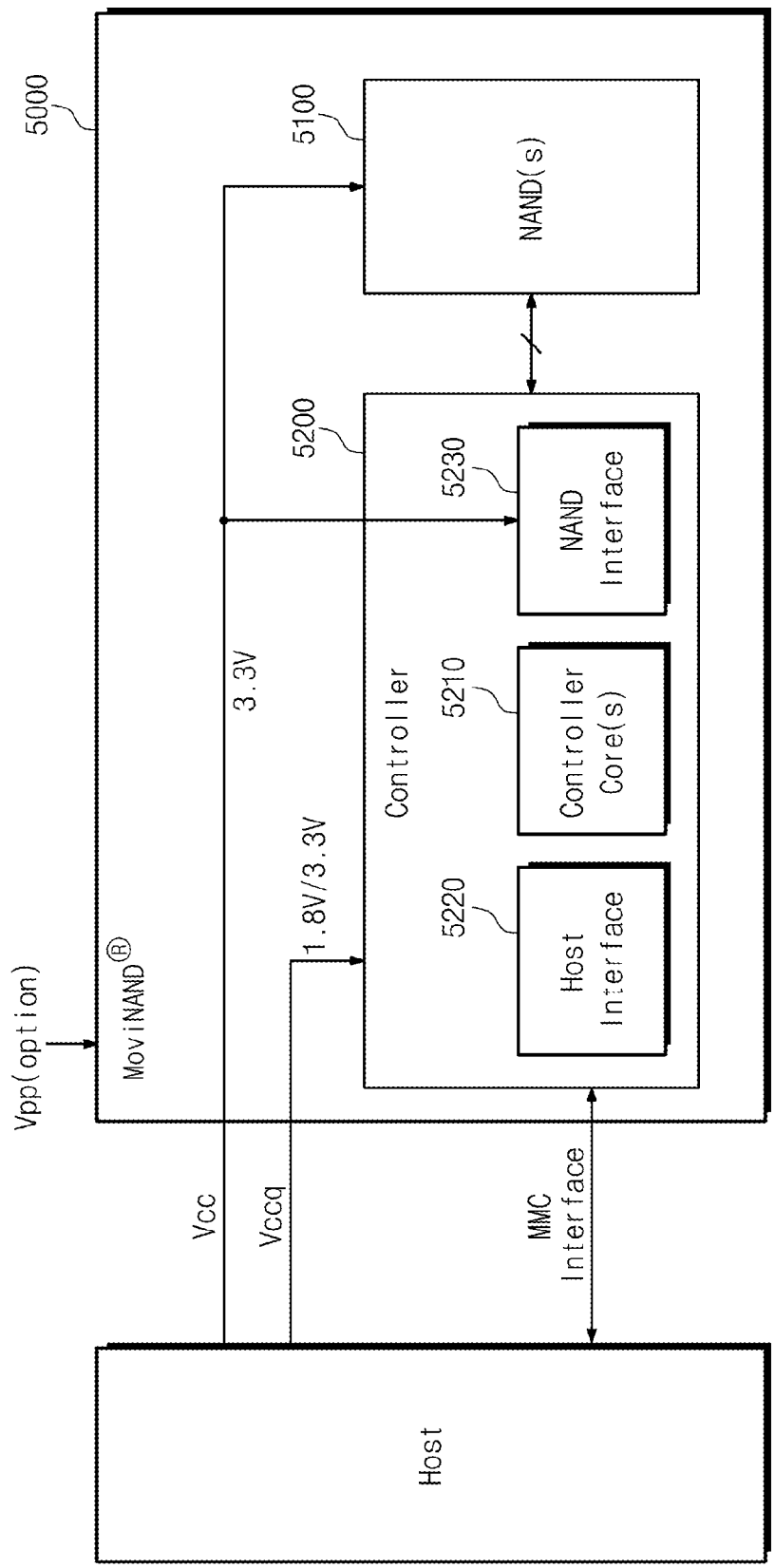
FIG. 17 is a block diagram schematically illustrating a moviNAND® device according to an embodiment of the inventive concept.

FIG. 17 is a block diagram schematically illustrating a moviNAND® according to an embodiment of the inventive concept. Referring to FIG. 17, a moviNAND® device 5000 may include at least one NAND flash memory device 5100 and a controller 5200. The moviNAND® device 5000 may support the MMC 4.4 (or, referred to as "eMMC") standard.

The NAND flash memory device 5100 may be a single data rate (SDR) NAND flash memory device or a double data rate (DDR) NAND flash memory device. In example embodiments, the NAND flash memory device 5100 may include NAND flash memory chips. Herein, the NAND flash memory device 5100 may be implemented by stacking the NAND flash memory chips at one package (e.g., FBGA, Fine-pitch Ball Grid Array, etc.).

The controller 5200 may be configured substantially the same as illustrated in FIGS. 2 and 3, and each of the NAND flash memory chips may be formed of a nonvolatile memory device illustrated in FIG. 4. For example, the controller 5200 may manage TLC blocks being a target block of a read reclaim operation, select a TLC block according to information stored at a queue at a specific time (e.g., at a write request of a host), and control the NAND flash memory device 5100 such that valid pages of data of the selected TLC block are moved to SLC blocks included in a nonvolatile memory device. The controller 5200 may process a read reclaim operation on the selected TLC block to be completed when valid pages of data of the selected TLC block are moved to SLC blocks included in a nonvolatile memory device.

The controller 5200 may be connected with the NAND flash memory device 5100 via a plurality of channels. The controller 5200 may include at least one controller core 5210, a host interface 5220, and a NAND interface 5230. The controller core 5210 may control an overall operation of the moviNAND device 5000. The host interface 5220 may be configured to perform an MMC interface between the controller 5200 and a host. The NAND interface 5230 may be configured to interface between the NAND flash memory device 5100 and the controller 5200. In example embodiments, the host interface 5220 may be a parallel interface (e.g., an MMC interface). In other example embodiments, the host interface 5220 of the moviNAND device 5000 may be a serial interface (e.g., UHS-II, UFS, etc.).

The moviNAND® device 5000 may receive power supply voltages Vcc and Vccq from the host. Herein, the power supply voltage Vcc (about 3.3V) may be supplied to the NAND flash memory device 5100 and the NAND interface 5230, while the power supply voltage Vccq (about 1.8V/3.3V) may be supplied to the controller 5200. In example embodiments, an external high voltage Vpp may be optionally supplied to the moviNAND® device 5000.

The moviNAND® device 5000 according to an embodiment of the inventive concept may be advantageous to store mass data and may also have an improved read characteristic. The moviNAND® device 5000 according to an embodiment of the inventive concept is applicable to small and low-power mobile products (e.g., devices known by the tradenames Galaxy S, iPhone, etc.).

Figure 18:
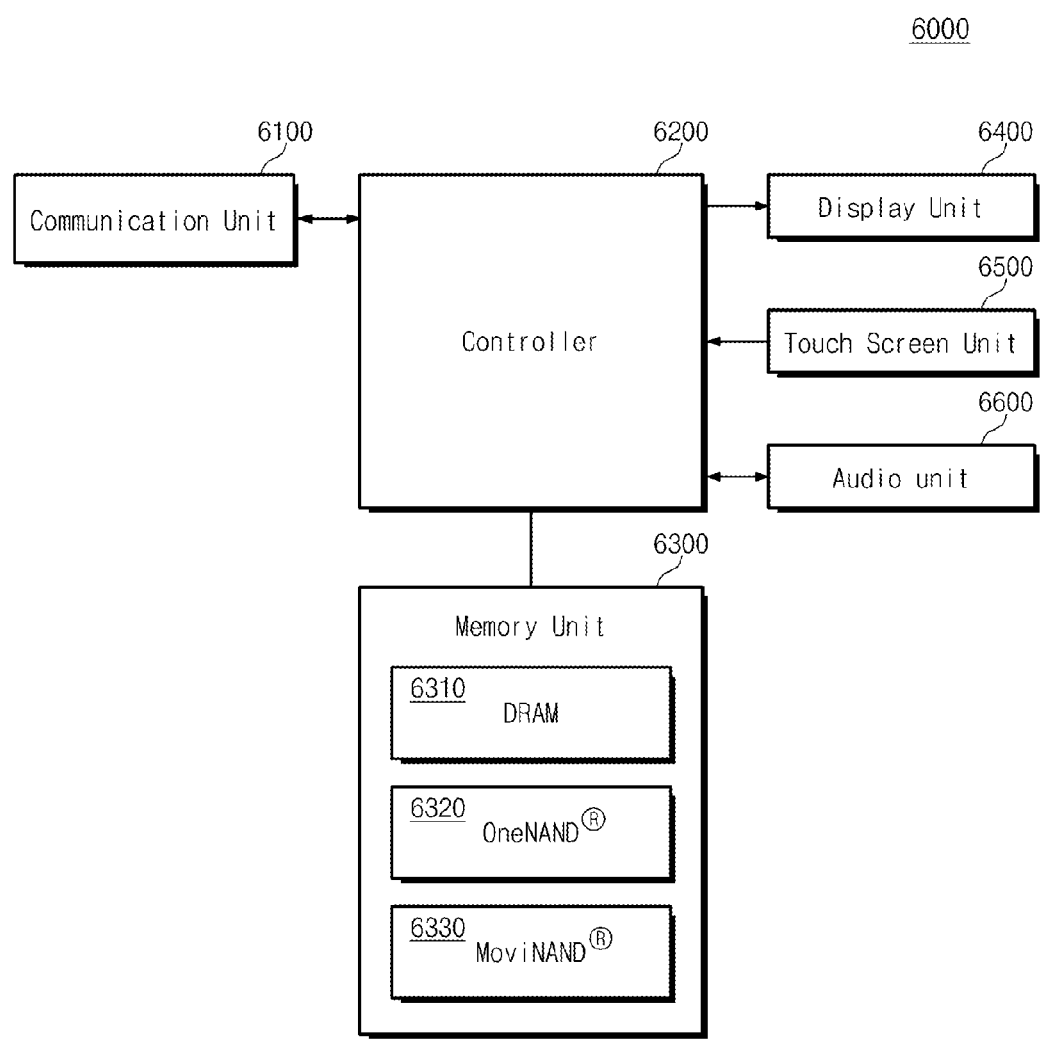
FIG. 18 is a block diagram schematically illustrating a communication device according to an embodiment of the inventive concept.

FIG. 18 is a block diagram schematically illustrating a communication device according to an embodiment of the inventive concept. Referring to FIG. 18, a communication device 6000 may include a communication unit 6100, a controller 6200, a memory unit 6300, a display unit 6400, a touch screen unit 6500, and an audio unit 6600. The memory unit 6300 may include at least one DRAM 6310, at least one OneNAND® 6320, and at least one moviNAND® 6330.

More detailed descriptions of mobile devices are disclosed in U.S. Patent Publication Nos. 2010/0010040, 2010/0062715, 2010/00199081, 2010/0309237 and 2010/0315325, the entire contents of which are herein incorporated by reference.

Figure 19:
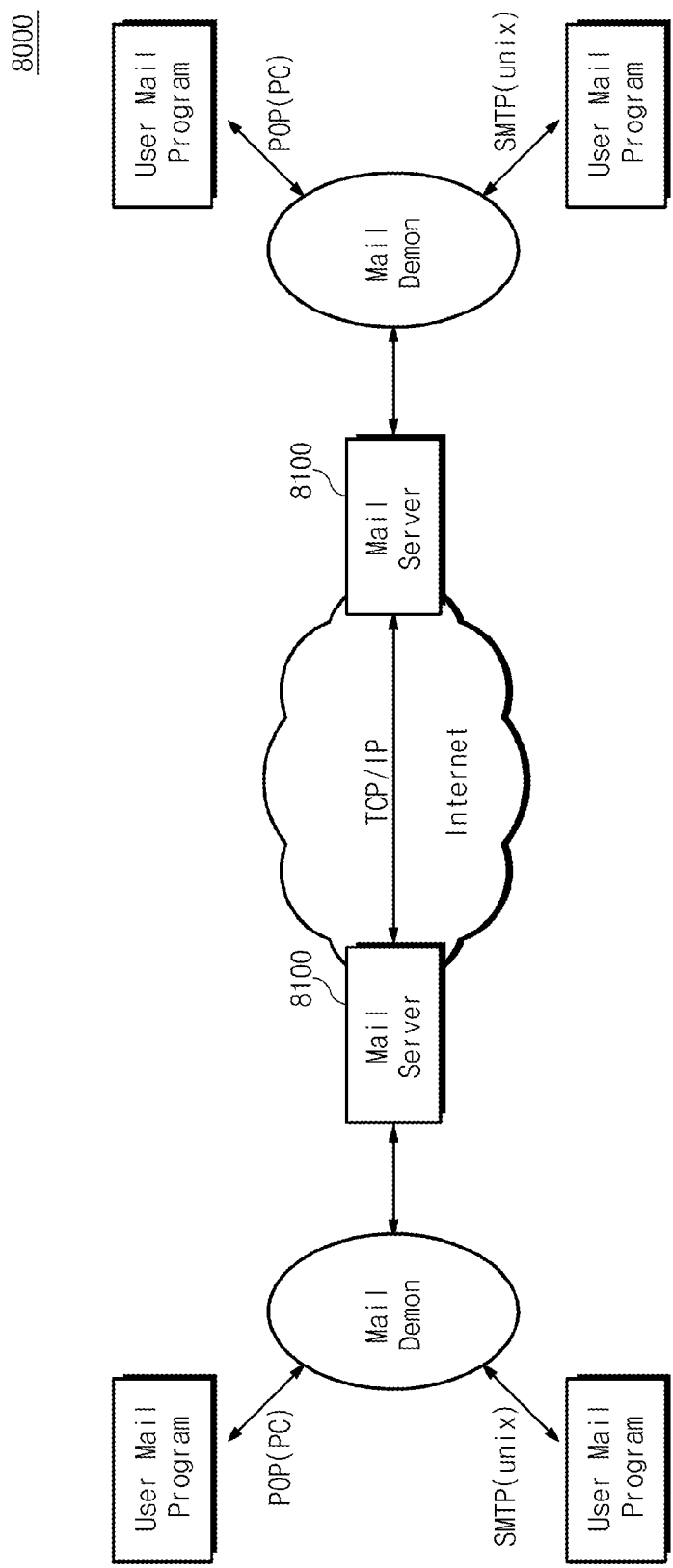
FIG. 19 is a diagram schematically illustrating systems to which a data storage device according to embodiments of the inventive concept is applied.

FIG. 19 is a diagram schematically illustrating systems to which a data storage device according to embodiments of the inventive concept is applied.

As illustrated in FIG. 19, a solid state drive including a data storage device according to an embodiment of the inventive concept may be applied to a main server 8100.

Figure 20:
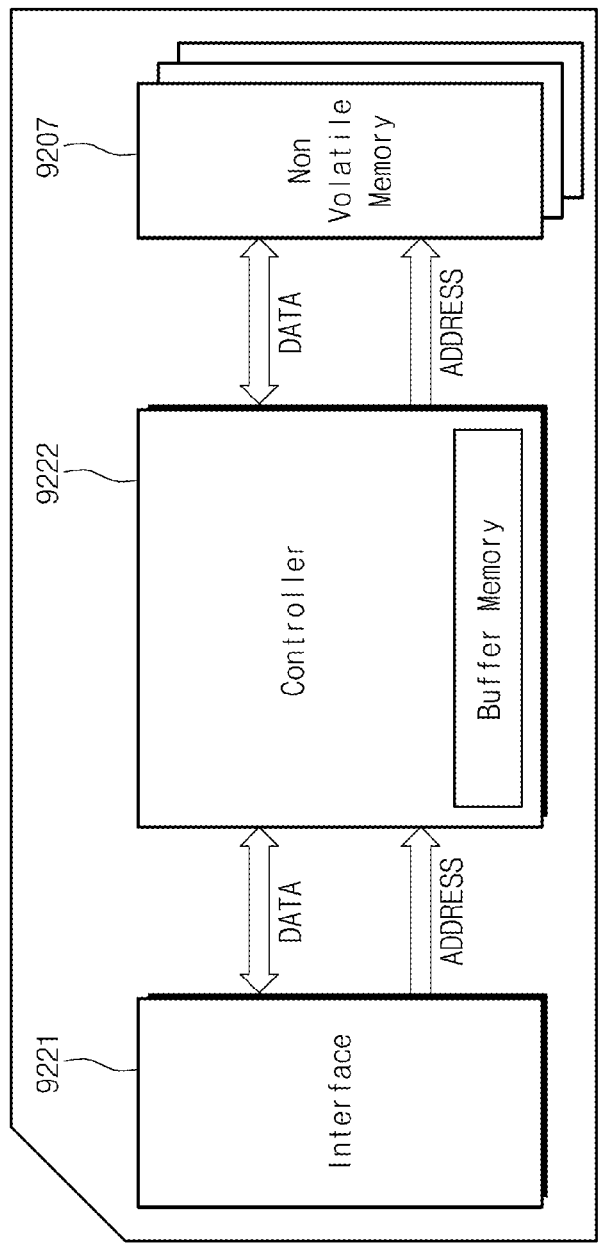
FIG. 20 is a block diagram schematically illustrating a memory card according to an embodiment of the inventive concept.

FIG. 20 is a block diagram schematically illustrating a memory card according to an embodiment of the inventive concept.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 20, the memory card may include an interface circuit 9221 for interfacing with an external device, a controller 9222 including a buffer memory and controlling an operation of the memory card, and at least one nonvolatile memory device 9207. The controller 9222 may be a processor which is configured to control write and read operations of the nonvolatile memory device 9207. The controller 9222 may be coupled with the nonvolatile memory device 9207 and the interface circuit 9221 via a data bus and an address bus. The interface circuit 9221 may interface with a host via a card protocol (e.g., SD/MMC) for data exchange between a host and a memory card.

The controller 9222 may be configured substantially the same as illustrated in FIGS. 2 and 3, and the nonvolatile memory device 9207 may be formed of a nonvolatile memory device as illustrated in FIG. 4. For example, the controller 9222 may manage TLC blocks being a target block of a read reclaim operation, select a TLC block according to information stored at a queue at a specific time (e.g., at a write request of a host), and control the nonvolatile memory device 9207 such that valid pages of data of the selected TLC block are moved to SLC blocks included in the nonvolatile memory device 9207. The controller 9222 may process a read reclaim operation on the selected TLC block to be completed when valid pages of data of the selected TLC block are moved to SLC blocks included in the nonvolatile memory device 9207.

Figure 21:
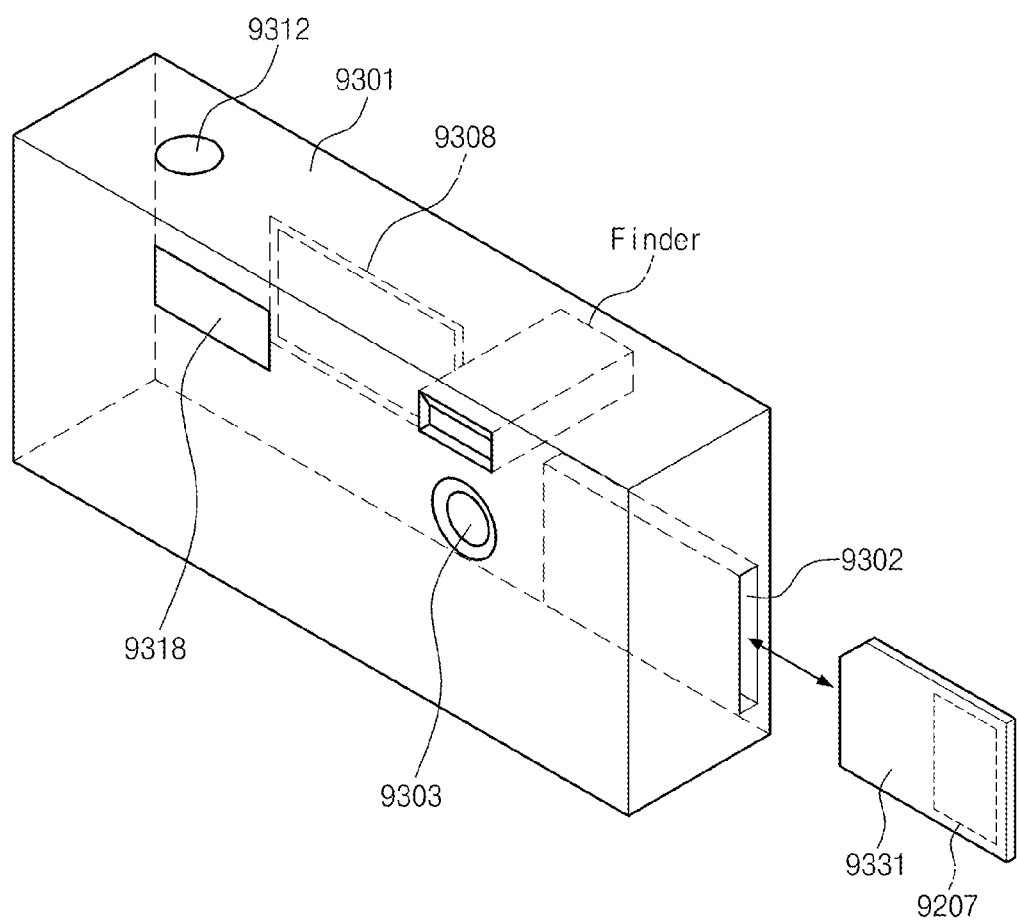
FIG. 21 is a block diagram schematically illustrating a digital still camera according to an embodiment of the inventive concept.

FIG. 21 is a block diagram schematically illustrating a digital still camera according to an embodiment of the inventive concept.

Referring to FIG. 21, a digital still camera may include a body 9301, a slot 9302, a lens 9303, a display circuit 9308, a shutter button 9312, a strobe 9318, and the like. The memory card 9331 may include a memory controller and a nonvolatile memory device as described in connection with FIG. 2. For example, the controller may manage TLC blocks being a target block of a read reclaim operation, select a TLC block according to information stored at a queue at a specific time (e.g., at a write request of a host), and control the nonvolatile memory device such that valid pages of data of the selected TLC block are moved to SLC blocks included in the nonvolatile memory device. The controller may process a read reclaim operation on the selected TLC block to be completed when valid pages of data of the selected TLC block are moved to SLC blocks included in the nonvolatile memory device.

If the memory card 9331 is a contact type memory card, an electric circuit on a circuit board may be electrically contacted with the memory card 9331 when it is inserted in the slot 9302. In the event that the memory card 9331 is a non-contact type memory card, an electric circuit on a circuit board may communicate with the memory card 9331 by wireless radio-frequency communication.

Figure 22:
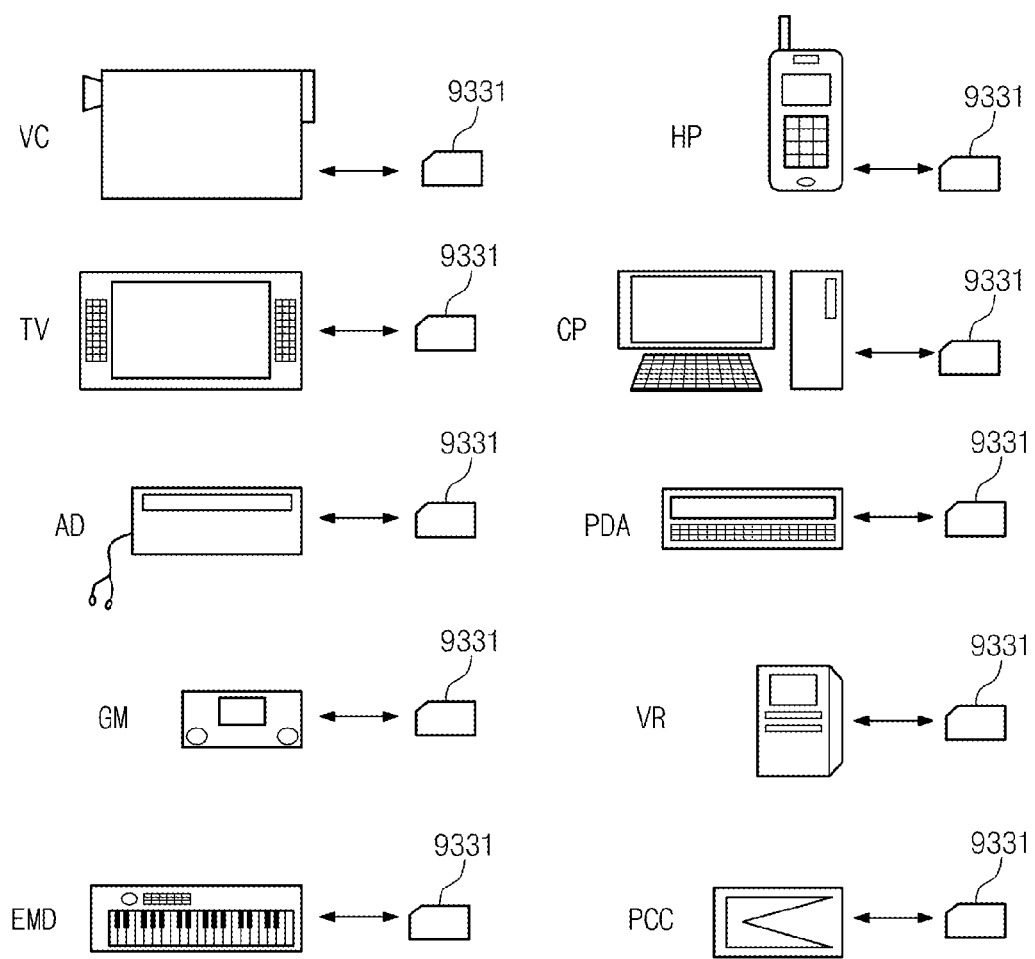
FIG. 22 is a diagram schematically illustrating various systems to which a memory card in FIG. 21 is applied.

FIG. 22 is a diagram schematically illustrating various systems to which a memory card in FIG. 21 is applied.

Referring to FIG. 22, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In example embodiment, memory cells can be formed of a variable resistance memory cell. An exemplary variable resistance memory cell and a memory device including the same are disclosed in U.S. Pat. No. 7,529,124, the entirety of which is incorporated by reference herein.

In other example embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

A memory device having a charge trap flash structure as a charge storage layer is disclosed in U.S. Pat. No. 6,858,906 and U.S. Patent Publication Nos. 2004/0169238 and 2006/0180851, the entireties of which are incorporated by reference herein. A source-drain free flash structure is disclosed in KR Patent No. 673020, the entirety of which is incorporated by reference herein.

A non-volatile memory device and/or a memory controller according to the inventive concept may be packaged using any of various types of packaging technologies. Examples of such packaging technologies include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system comprising:
a nonvolatile memory device including a plurality of first memory cells and a plurality of second memory cells, each of the plurality of first memory cells being configured to store 3-bit data, each of the plurality of second memory cells being configured to store 1-bit data; and
a controller configured to control the nonvolatile memory device to perform a read operation, a program operation and a re-program operation, wherein:
the controller is configured to perform an error checking and correction (ECC) operation on first data to generate ECC-performed first data, the first data being read from a first portion of the plurality of first memory cells at a first voltage level,
the controller is configured to perform a read retry operation and the ECC operation on second data to generate ECC-performed second data when a number of error bits of the ECC-performed first data exceeds a threshold correctable by the ECC operation, the read retry operation including reading the second data stored in the first portion of the plurality of first memory cells at a second voltage level that is different from the first voltage level, the second data being read from the first portion of the plurality of first memory cells,
the controller is configured to output to the nonvolatile memory device first page data including either the ECC-performed first data or the ECC-performed second data,
the nonvolatile memory device is configured to program the first page data in a first portion of the plurality of second memory cells,
the nonvolatile memory device is configured to read the programmed first page data in the first portion of the plurality of second memory cells,
the nonvolatile memory device is configured to program in a second portion of the plurality of first memory cells the programmed first page data that is read at a first time from the first portion of the plurality of second memory cells,
the nonvolatile memory device is configured to re-program in the second portion of the plurality of first memory cells the programmed first page data that is read at a second time from the first portion of the plurality of second memory cells, and
a threshold voltage distribution corresponding to the re-programming in the second portion is narrower than a threshold voltage distribution corresponding to the programming in the second portion.

2. The memory system of claim 1, wherein the first time is different from the second time.

3. The memory system of claim 1, wherein the controller is configured to program in the second portion of the plurality of first memory cells the first page data that is read at the first time from the first portion of the plurality of second memory cells, without performing the ECC operation on the first page data.

4. The memory system of claim 1, wherein the controller is configured to perform the read retry operation and the ECC operation on third data that is read from the first portion of the plurality of first memory cells.

5. The memory system of claim 1, wherein the controller is configured to perform the ECC operation on third data that is read from the second portion of the plurality of first memory cells.

6. The memory system of claim 5, wherein the first portion of the plurality of first memory cells and the second portion of the plurality of first memory cells are included in the same memory block.

7. The memory system of claim 5, wherein the third data is included in second page data that is output to the nonvolatile memory device from the controller.

8. The memory system of claim 7, wherein each of the first page data and the second page data is valid page data.

9. The memory system of claim 1, wherein the controller is configured to read and program the first page data in the first portion of the plurality of second memory cells after the controller processes a request by an external device.

10. The memory system of claim 7, wherein the first page data and the second page data are output to the nonvolatile memory device from the controller within a predetermined time period.

11. The memory system of claim 1, wherein the nonvolatile memory device includes a memory cell array having a vertical or stack-type three-dimensional array structure.

12. A memory system comprising:
a nonvolatile memory device including:

a first group of flash memory cells formed of a plurality of first memory blocks, each of the first group of flash memory cells being configured to store 1-bit data per cell; and a second group of flash memory cells formed of a plurality of second memory blocks, each of the second group of flash memory cells being configured to store 3-bit data per cell; and a memory controller configured to control the nonvolatile memory device, wherein:

the memory controller is configured to perform a read reclaim operation to transfer valid data stored in one of the plurality of second memory blocks to one or more memory blocks of the plurality of first memory blocks, the read reclaim operation is performed on a first portion of the valid data at a first time, and is performed on a second portion of the valid data at a second time that is different from the first time, the memory controller is configured to perform one or more program operations to transfer a third portion of the valid data that is read from the one or more memory blocks of the plurality of first memory blocks to another of the plurality of second memory blocks other than the one of the plurality of second memory blocks, each of the one or more program operations is a three-step programming operation, the three-step programming operation includes a first program step and a second program step that occurs after the first program step, and a second threshold voltage distribution corresponding to the second program step is narrower than a first threshold voltage distribution corresponding to the first program step.

13. The memory system of claim 12, wherein the memory controller is configured to perform the one or more program operations to transfer the third portion of the valid data to the other plurality of second memory blocks, without performing an error checking and correction (ECC) operation on the third portion of the valid data.

14. The memory system of claim 12, wherein the read reclaim operation includes a read retry operation on at least a portion of the valid data.

15. The memory system of claim 14, wherein:
the read reclaim operation is performed during a first time period and a second time period, and
the first time period and the second time period are separated to each other.

16. The memory system of claim 12, wherein the nonvolatile memory device includes a memory cell array having a vertical or stack-type three-dimensional array structure.

17. A method of operating a nonvolatile memory system including a controller and a nonvolatile memory device, the nonvolatile memory device including a plurality of first memory cells and a plurality of second memory cells, each of the plurality of first memory cells being configured to store 3-bit data, each of the plurality of second memory cells being configured to store 1-bit data, the method comprising:
reading, at a first voltage level, first data from a first portion of the plurality of first memory cells;
performing an error checking and correction (ECC) operation on the first data to generate ECC-performed first data;
reading, at a second voltage level, second data that is read from the first portion of the plurality of first memory cells when a number of error bits of the ECC-performed first data exceeds a threshold correctable by the ECC operation;

performing the ECC operation on the second data to generate ECC-performed second data;
outputting to the nonvolatile memory device first page data that includes either the ECC-performed first data or the ECC-performed second data;
programming the first page data in a first portion of the plurality of second memory cells;
reading the programmed first page data in the first portion of the plurality of second memory cells at a first time;
programming in a second portion of the plurality of first memory cells the programmed first page data that is read at the first time;
reading the programmed first page data in the first portion of the plurality of second memory cells at a second time; and
re-programming in the second portion of the plurality of first memory cells the programmed first page data that is read at the second time, wherein
a threshold voltage distribution corresponding to the re-programming of the first memory cells is narrower than a threshold voltage distribution corresponding to the programming of the first memory cells.

18. The method of claim 17, wherein the programming of the first page data in the second portion of the plurality of first memory cells is performed without the ECC operation on the first page data.

19. The method of claim 17, further comprising:
performing the ECC operation on third data that is read from a third portion of the plurality of first memory cells, the third data being included in second page data that is output to the nonvolatile memory device from the controller, and
the first page data and the second page data are output to the nonvolatile memory device from the controller within a predetermined time period.

20. The method of claim 19, wherein the first page data and the second page data are output to the nonvolatile memory device from the controller after the controller processes a request by an external device.

21. The method of claim 17, wherein the nonvolatile memory device includes a memory cell array having a vertical or stack-type three-dimensional array structure.

22. A memory system comprising:
a nonvolatile memory device including a plurality of first memory cells and a plurality of second memory cells, each of the plurality of first memory cells being configured to store 3-bit data, each of the plurality of second memory cells being configured to store 1-bit data, the nonvolatile memory device including a memory cell array having a vertical or stack-type three-dimensional array structure; and
a controller configured to control the nonvolatile memory device to perform a read operation, a program operation and a re-program operation, wherein:
the controller is configured to perform an error checking and correction (ECC) operation on first data to generate ECC-performed first data, the first data being read from a first portion of the plurality of first memory cells at a first voltage level,
the controller is configured to perform a read retry operation and the ECC operation on second data to generate ECC-performed second data when a number of error bits of the ECC-performed first data exceeds a threshold correctable by the ECC operation, the read retry operation including reading the second data stored in the first portion of the plurality of first memory cells at a second voltage level that is different from the first voltage level, the second data being read from the first portion of the plurality of first memory cells, the controller is configured to output to the nonvolatile memory device first page data including either the ECC-performed first data or the ECC-performed second data, the nonvolatile memory device is configured to program the first page data in a first portion of the plurality of second memory cells, the nonvolatile memory device is configured to read the programmed first page data in the first portion of the plurality of second memory cells, the nonvolatile memory device is configured to program in a second portion of the plurality of first memory cells the programmed first page data that is read at a first time from the first portion of the plurality of second memory cells, the nonvolatile memory device is configured to re-program in the second portion of the plurality of first memory cells the programmed first page data that is read at a second time from the first portion of the plurality of second memory cells, the first time is different from the second time, and a threshold voltage distribution corresponding to the re-programming in the second portion is narrower than a threshold voltage distribution corresponding to the programming in the second portion.

23. The memory system of claim 22, wherein the controller is configured to program in the second portion of the plurality of first memory cells the first page data that is read at the first time from the first portion of the plurality of second memory cells, without performing the ECC operation on the first page data.

24. The memory system of claim 22, wherein the controller is configured to perform the read retry operation and the ECC operation on third data that is read from the first portion of the plurality of first memory cells.

25. The memory system of claim 22, wherein the controller is configured to perform the ECC operation on third data that is read from the second portion of the plurality of first memory cells.

26. The memory system of claim 25, wherein the first portion of the plurality of first memory cells and the second portion of the plurality of first memory cells are included in the same memory block.

27. The memory system of claim 25, wherein the third data is included in second page data that is output to the nonvolatile memory device from the controller.

28. The memory system of claim 27, wherein each of the first page data and the second page data is valid page data.

* * * * *